(12) United States Patent
Miki et al.

(10) Patent No.: US 6,403,987 B1
(45) Date of Patent: *Jun. 11, 2002

(54) ELECTRODE FOR LIGHT-EMITTING SEMICONDUCTOR DEVICES

(75) Inventors: Hisayuki Miki; Takashi Udagawa; Noritaka Muraki, all of Chichibu; Mineo Okuyama, Chiba, all of (JP)

(73) Assignee: Showa Denko K.K., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/694,325

(22) Filed: Oct. 24, 2000

Related U.S. Application Data

(63) Continuation of application No. 09/073,765, filed on May 7, 1998, now Pat. No. 6,268,618.
(60) Provisional application No. 60/055,991, filed on Aug. 18, 1997.

(30) Foreign Application Priority Data

| May 8, 1997 | (JP) | ............................................. 9-118315 |
| Jul. 22, 1997 | (JP) | ............................................. 9-196025 |
| Sep. 1, 1997 | (JP) | ............................................. 9-236117 |
| Oct. 21, 1997 | (JP) | ............................................. 9-288770 |

(51) Int. Cl.[7] .......................... H01L 33/00; H01L 23/48
(52) U.S. Cl. ........................ 257/99; 257/103; 257/743; 257/745
(58) Field of Search .................. 257/99, 103, 743, 257/744, 745, 748, 91

(56) References Cited

U.S. PATENT DOCUMENTS

| 5,760,423 A | 6/1998 | Kamakura et al. ............. 257/99 |
| 5,977,566 A | 11/1999 | Okazaki et al. ................ 257/99 |

FOREIGN PATENT DOCUMENTS

| JP | 6-314822 | 11/1994 | ........... H01L/33/00 |
| JP | 7-94782 | 4/1995 | ........... H01L/33/00 |
| JP | 8-250768 | 9/1996 | ........... H01L/33/00 |
| JP | 8-250769 | 9/1996 | ........... H01L/33/00 |
| JP | 9-64337 | 3/1997 | ........... H01L/29/43 |
| JP | 9-129919 | 5/1997 | ........... H01L/33/00 |

*Primary Examiner*—Minh Loan Tran
(74) *Attorney, Agent, or Firm*—Sughrue Mion, PLLC

(57) ABSTRACT

An electrode for a light-emitting semiconductor device includes a light-permeable electrode formed to come into contact with the surface of the semiconductor, and a wire-bonding electrode that is in electrical contact with the light-permeable electrode and is formed to come into partial contact with the surface of the semiconductor with at least a region in contact with the semiconductor having a higher contact resistance per unit area with respect to the semiconductor than a region of the light-permeable electrode in contact with the semiconductor. This device electrode is formed by forming a wire-bonding electrode on a portion of the surface of a p-type GaN-base compound semiconductor, forming on the surface of the semiconductor a first layer that is of at least one member selected from the group consisting of Au, Pt and Pd and is formed to overlay the upper surface of the wire-bonding electrode at a portion at which the wire-bonding electrode is located, forming on the first layer a second layer that is of at least one metal selected from the group consisting of Ni, Ti, Sn, Cr, Co, Zn, Cu, Mg and In, and forming a light-permeable electrode by heat-treating the first and second layers in an atmosphere that contains oxygen.

3 Claims, 13 Drawing Sheets

ELECTRODE FOR LIGHT-EMITTING SEMICONDUCTOR DEVICES

CROSS REFERENCE TO RELATED APPLICATIONS

This is a Continuation of Application Ser. No. 09/073,765 filed May 7, 1998, now U.S. Pat. No. 6,268,618 the disclosure of which is incorporated herein by reference.

This application is an application filed under 35 U.S.C. §111(a) claiming benefit pursuant to 35 U.S.C. §119(e)(1) of the filing date of the Provisional Application No. 60/055,991 filed Aug. 18, 1997 pursuant to 35 U.S.C. §111(b).

BACKGROUND OF THE INVENTION

1. Field of the Invention

The present invention relates to an electrode for a light-emitting semiconductor device formed on a surface of a p-type GaN-base compound semiconductor, and to a method of producing the electrode.

2. Description of the Prior Art

In recent years, GaN-base compound semiconductor materials are drawing attention as a semiconductor material for light-emitting devices which emit short-wavelength light. The GaN-base compound semiconductor is formed on various oxide substrates such as sapphire single crystal or a III–V Group compound substrate by the metal organic chemical vapor deposition method (MOCVD method), a molecular beam epitaxy method (MBE method) or other such method.

A GaN-base compound semiconductor is a III–V Group compound semiconductor generally represented by $Al_xGa_yIn_{1-x-y}N$ $0 \leq x \leq 1$, $0 \leq y \leq 1$, $0 \leq x+y \leq 1$).

In the case of a light-emitting device formed by laminating layers of this GaN-base compound semiconductor that uses a substrate of an electrically insulating material, such as a sapphire substrate, an electrode cannot be provided on the back surface of the substrate, unlike when a semiconductor substrate such as a GaAs or GaP substrate is used that is electrically conductive. Accordingly, a pair of positive and negative electrodes are formed on the same surface of the light-emitting device. Also, when electricity is passed through the pair of electrodes to produce light emission, as the sapphire or other such substrate material is an insulator, the light is emitted from the surface on which the electrodes are provided. Namely, the light is emitted upward.

A characteristic of the GaN-base compound semiconductor material is that the current diffusion in the transverse direction is small. Due to this characteristic, even when electrodes are formed and light is emitted by passing electricity therebetween, the major part of the current flow takes place directly beneath the electrodes, as a result of which the light emission is limited to the region right under the electrodes and does not readily diffuse to the peripheral region of the electrodes. Therefore, in the case of conventional opaque electrodes, the light emission is interrupted by the electrode itself and cannot be taken out from the upside of the electrode. As a result, the intended improvement in the light emission intensity is not achieved.

To overcome this drawback, JP-A-6-314822 discloses a technique relating to the device structure whereby a light-permeable electrode comprising a very thin metal is used as a p-type electrode and formed almost over the entire front surface of the device to thereby allow the emitted light to pass through the light-permeable electrode and be emitted externally from the upper side. In this disclosure, Au, Ni, Pt, In, Cr, or Ti, for example, is used as the electrode material and the metal film formed by vapor deposition is heat-treated at a temperature of 500° C. or higher to induce sublimation of the metal, so that the thickness is reduced to from 0.001 to 1 μm to thereby impart light permeability. The term "light-permeable" as used herein with reference to the electrode refers to an electrode through which light emission generated under the electrode can be observed. To enable observation to take place through the electrode, the electrode must have a light transmittance of at least 10%.

However, such a thin metal film has low strength that makes it impossible to directly bond wires to the thin film for injecting electrical current from an outside source. For this reason, electrodes for use in semiconductor light-emitting devices generally employ a structure comprising forming, in addition to the light-permeable electrode, a wire-bonding electrode having electrical contact with the light-permeable electrode, and using this wire-bonding electrode to connect the wire used to carry current to the light-permeable electrode.

When a light-permeable electrode is formed using thin metal film, as shown by FIG. 23, the structure generally used comprises forming the wire-bonding electrode 8 on the light-permeable electrode 7. However, with this structure it is difficult to ensure adhesion between the front surface of the light-permeable electrode 7 and the lower surface of the wire-bonding electrode 8, sometimes causing the wire-bonding electrode 8 to peel off during the electrode production process.

To overcome this, JP-A-7-94782 discloses a technique for improving bonding properties, illustrated by FIG. 24. In this arrangement, a window 70 is formed in the light-permeable electrode 7 via which the surface of the semiconductor 9 is exposed, the wire-bonding electrode 8 is formed on the window 70 to effect direct contact between the wire-bonding electrode 8 and the surface of the semiconductor 9.

In most cases a thick film about 1 μm in thickness is used for the wire-bonding electrode as a way of absorbing the impact of the wire bonder. Because it is that thick, light permeability cannot be imparted to the wire-bonding electrode. This means that light emission occurring directly below the wire-bonding electrode is interrupted by the wire-bonding electrode, and therefore cannot be emitted to the outside. Thus, to achieve higher emission brightness, a structure is required whereby current is not injected into the semiconductor portion directly beneath the wire-bonding electrode, but flows instead to the light-permeable electrode.

JP-A-8-250768 discloses a technique whereby current does not flow to the region below the wire-bonding electrode. This is achieved by providing the semiconductor layers below the wire-bonding electrode with a high-resistance region by various methods such as by forming a silicon oxide layer, leaving a region that is not subjected to p-type formation treatment, using annealing or ion implantation and so forth. The high-resistance region prevents current flowing under the wire-bonding electrode, directing the current instead to the light-permeable electrode to thereby efficiently use the current.

However, in the disclosure of JP-A-8-250768, the structure providing the high-resistance region under the wire-bonding electrode requires the formation of silicon oxide layers and steps to increase the resistance of the semiconductor. Thus, the process is complicated and production takes long time. For example, in order to form silicon oxide layers, it is necessary to use photolithography to effect patterning, or plasma CVD processes and the like. Similarly, photolithography, ion implantation, annealing and other such processes have to be used to form a high-resistance semiconductor region. All these processes are complex time-consuming.

Also, when the above-described high-resistance region arrangement is to be applied to the configuration of the above JP-A-7-94782 in which the wire-bonding electrode 8 is provided on the window 70 (FIG. 24), the high-resistance region is formed in the semiconductor 9 beneath the wire-bonding electrode 8. This produces an arrangement in which the current has to flow from the peripheral portion 8a of the wire-bonding electrode 8 into the semiconductor 9, via the light-permeable electrode 7, generating light emission in the injection region 91. Since the peripheral portion 8a acts as a barrier to the generated light, the light emission cannot be taken out upward. The light emission is therefore wasted, reducing emission efficiency.

The object of the present invention is to provide an electrode for light-emitting semiconductor devices, that uses a simple structure that is able to securely block current flow under the wire-bonding electrode and can improve the light emission efficiency.

SUMMARY OF THE INVENTION

The present invention attains the above object by providing an electrode for a light-emitting semiconductor device, formed on the surface of a p-type GaN-base compound semiconductor, comprising a light-permeable electrode formed to come into contact with the surface of the semiconductor, and a wire-bonding electrode that is in electrical contact with the light-permeable electrode and is formed to come into partial contact with the surface of the semiconductor with at least a region in contact with the semiconductor having a higher contact resistance per unit area with respect to the semiconductor than a region of the light-permeable electrode in contact with the semiconductor.

The wire-bonding electrode may have a multilayer structure in which the topmost layer is formed of Al or Au.

The light-permeable electrode may comprise a first layer formed to come into contact with the surface of the semiconductor and comprising at least one member selected from the group consisting of Au, Pt and Pd, and a second layer formed on the first layer and comprising a light-permeable metal oxide containing an oxide of at least one metal selected from the group consisting of Ni, Ti, Sn, Cr, Co, Zn, Cu, Mg and In.

The second layer has an oxygen composition that gradually decreases from the second layer toward the first layer in the region near the interface between the second layer and the first layer.

The first layer may contain a metal element which is a main component of the metal oxide constituting the second layer.

The light-permeable electrode may be formed to overlay the upper surface of the wire-bonding electrode at a portion at which the wire-bonding electrode is disposed.

The light-permeable electrode may be formed to overlay the periphery of the upper surface of the wire-bonding electrode.

The electrode light-permeable electrode may be formed to cover the entire upper surface of the wire-bonding electrode.

A portion of the second layer of the light-permeable electrode that overlays the wire-bonding electrode may be removed to expose the first layer.

The electrode for a light-emitting semiconductor device according to the present invention also includes an electrode formed on the surface of a p-type GaN-base compound semiconductor, comprising a light-permeable electrode formed to come into contact with the surface of the semiconductor, and a wire-bonding electrode that is in electrical contact with the light-permeable electrode and is formed with a bottom surface in partial contact with the surface of the semiconductor and an upper surface overlaid by the light-permeable electrode.

The light-permeable electrode may be formed to overlay the periphery of the upper surface of the wire-bonding electrode.

The light-permeable electrode may be formed to cover the entire upper surface of the wire-bonding electrode.

The present invention also provides a method of producing an electrode for a light-emitting semiconductor device, formed on a surface of a p-type GaN-base compound semiconductor, comprising a first step of forming a wire-bonding electrode on a portion of the surface of the semiconductor, a second step of forming a first layer on the surface of the semiconductor, the first layer comprising at least one member selected from the group consisting of Au, Pt and Pd and being formed to overlay the upper surface of the wire-bonding electrode at a portion at which the wire-bonding electrode is located, a third step of forming on the first layer a second layer that comprises at least one metal selected from the group consisting of Ni, Ti, Sn, Cr, Co, Zn, Cu, Mg and In, and a fourth step of forming a light-permeable electrode by heat-treating the first and second layers in an atmosphere that contains oxygen.

The method of producing an electrode for a light-emitting semiconductor device according to the present invention may instead comprise a first step of forming a wire-bonding electrode on a portion of the surface of the semiconductor, a second step of forming an alloy layer on the surface of the semiconductor, the alloy layer comprising an alloy that contains at least one metal selected from the group consisting of Au, Pt and Pd and at least one metal selected from the group consisting of Ni, Ti, Sn, Cr, Co, Zn, Cu, Mg and In and being formed to overlay the upper surface of the wire-bonding electrode at a portion at which the wire-bonding electrode is located, and a third step of forming a light-permeable electrode by heat-treating the alloy layer in an atmosphere containing oxygen to form on the semiconductor side a first layer comprised of metal or alloy, and a second layer comprised of a light-permeable metal oxide formed on the first layer.

As described in the foregoing, the region of the wire-bonding electrode in contact with the semiconductor is formed to have a higher contact resistance per unit area with respect to the semiconductor than the region of the light-permeable electrode in contact with the semiconductor, making it possible to securely prevent current flowing under the wire-bonding electrode, so that all the current from around the wire-bonding electrode is injected into the light-permeable electrode, from where it enters the laminate body and contributes to the light emission function. That is, light emission is not generated under the wire-bonding electrode, so that with the light not being obstructed by the wire-bonding electrode, substantially all the light that is generated can be emitted upward from the light-permeable electrode. Thus, the current can be effectively utilized and the light emission efficiency improved.

This electrode configuration having a wire-bonding electrode and a light-permeable electrode can be formed by growing thin films using a method such as a vapor deposition method. The process is very simple, involving just the vapor deposition of the metal material, so formation of the films can be effected rapidly. That is, current flow under the wire-bonding electrode can be securely blocked by means of a simple structure that can be readily formed without having to undertake complex processes.

Further features of the invention, its nature and various advantages will be more apparent from the accompanying drawings and following detailed description of the invention.

DESCRIPTION OF THE PREFERRED EMBODIMENT

Embodiments of the present invention will now be described with reference to the drawings.

Figure 1:
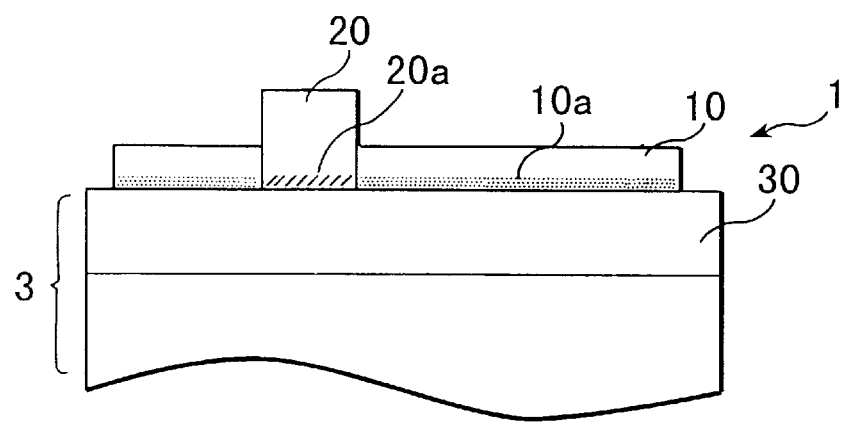
FIG. 1 is a general view of the structure of the electrode of the invention.

FIG. 1 is a general view showing the structure of the electrode for a semiconductor light-emitting device of the invention. In the drawing, the electrode 1 for a semiconductor light-emitting device has a light-permeable electrode 10 disposed on the upper layer side of a laminate body 3 constituting a semiconductor light-emitting device, where it is formed to be in contact with the surface of p-type GaN-base semiconductor 30, and a wire-bonding electrode 20 that is in electrical contact with the light-permeable electrode 10 and is formed to come into partial contact with the surface of the semiconductor 30. The wire-bonding electrode 20 is formed so that at least a region 20a in contact with the semiconductor 30 has a higher contact resistance per unit area with respect to the semiconductor 30 than a region 10a of the light-permeable electrode 10 in contact with the semiconductor 30.

In the electrode 1 shown in FIG. 1, a pair of positive and negative electrode are formed on the side of the semiconductor 30 of the laminate body 3. However, the negative electrode was omitted from FIG. 1.

The region 20a of the wire-bonding electrode 20 electrode in contact with the semiconductor 30 is formed of one metal or an alloy of two or more metals selected from the group consisting of Tl, In, Mn, Ti, Al, Ag, Sn, AuBe, AuZn, AuMg, AlSi, TiSi and TiBe. Subsequent heat treatment can enhance firm adherence between the electrode 1 and the semiconductor 30.

Of these metals and alloys, selecting Ti, TiSi, TiBe, Al, AlSi or AuBe or the like enables a stronger adhesion with the surface of the semiconductor 30 to be maintained.

In contrast, the region 10a of the light-permeable electrode 10 is formed of a metal selected from a group of metals each having a lower contact resistance relative to the semiconductor 30, such as Au, Pd, Pt, Ni and Cr. Light permeability can be imparted to the metal by forming the metal as a thin film having a thickness of from 1 nm to 1000 nm.

Figure 2:
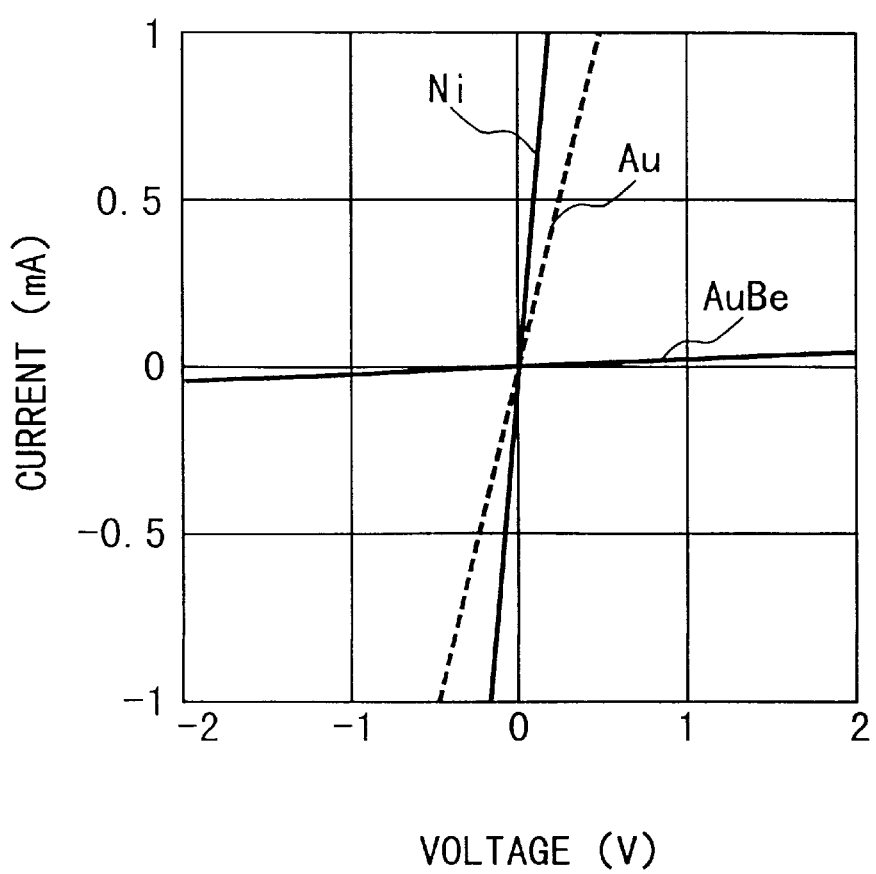
FIG. 2 is a graph showing the contact resistance characteristics (voltage-current characteristics) of each metal or alloy with respect to p-type GaN semiconductor.

FIG. 2 shows the contact resistance characteristics (voltage-current characteristics) of each metal or alloy with respect to p-type GaN semiconductor. As shown in FIG. 2, Ni and Au have low contact resistance with respect to p-type GaN semiconductor, while the alloy AuBe has an extremely high contact resistance, showing its suitability as a material for the wire-bonding electrode region 20a in contact with the semiconductor 30.

Since the region 20a in contact with the semiconductor 30 is formed to have a higher contact resistance, with respect to semiconductor 30, than the light-permeable electrode region 10a in contact with the semiconductor 30, as described above, it is possible to securely prevent current flowing under the wire-bonding electrode 20, ensuring that all the current from around the wire-bonding electrode 20 is injected into the light-permeable electrode 10, from where it enters the laminate body 3 and contributes to the light emission effect. That is, light emission is not generated under the wire-bonding electrode 20, so that with the light not being obstructed by the wire-bonding electrode 20, substantially all the light that is generated can be emitted externally (upward, with respect to FIG. 1) from the light-permeable electrode 10. This enables the current to be effectively utilized and the light emission efficiency to be improved.

The electrode structure consisting of the wire-bonding electrode 20 and the light-permeable electrode 10 can be formed by growing thin films using a vacuum deposition method or the like. The process is very simple, involving just the selection and vapor deposition of the metal materials, so the films can be grown in a short space of time. That is, current flow under the wire-bonding electrode 20 can be securely blocked by means of a simple structure that can be readily formed without having to undertake complex processes.

In most cases gold wire is used to connect the power supply to the wire-bonding electrode 20. More specifically, small gold bonding balls are used to effect the connection between the gold wire and the wire-bonding electrode 20 by using ultrasonic waves to heat and fuse the bonding balls with the electrode material. The electrode materials that fuse with the bonding balls are limited, Au and Al being well-known ones. When a metal or alloy is used that is suitable for forming contact with the semiconductor 30 but does not fuse well with the bonding balls, a multilayer structure may be used for the wire-bonding electrode 20 to provide the wire-bonding electrode 20 with a surface formed of a metal that fuses well with the bonding balls.

Figure 3:
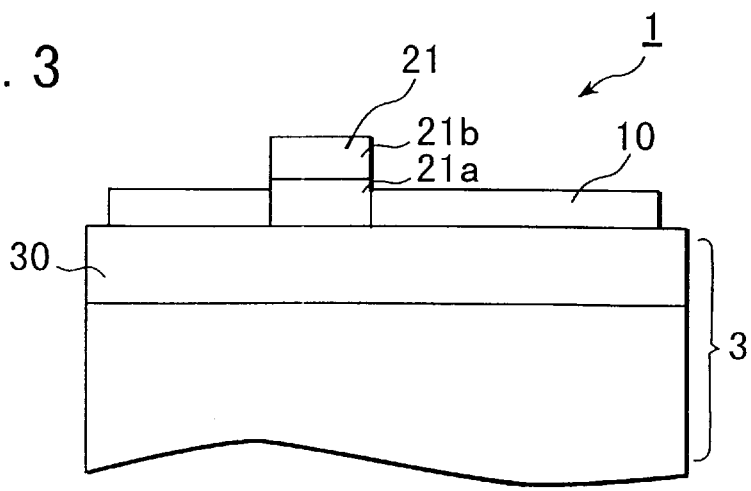
FIG. 3 shows the two-layer structure of the wire-bonding electrode of the present invention.

FIG. 3 shows a wire-bonding electrode having a two-layer structure. In the drawing, wire-bonding electrode 21 consists of a lower layer 21a formed of AuBe, which has a high contact resistance to the semiconductor 30, while the upper layer 21b is formed of Au, which has good fusing properties with respect to bonding balls.

In cases where there is poor adhesion between the metal used for the upper layer 21b and the metal used for the lower layer 21a, a three-layer structure can be used or a structure with more than three layers. Using such a multilayer structure makes it possible to realize a wire-bonding having both a high contact resistance to the semiconductor 30 and good fusability with bonding balls.

If a metal such as, for example, Al is used that exhibits a high contact resistance relative to the semiconductor 30 and high bonding ball fusability, the entire wire-bonding electrode 20 can be formed as a single layer of Al.

In the arrangements shown in FIGS. 1 and 3, the light-permeable electrode 10 is shown as formed around and in contact with the outside peripheral surface of the wire-bonding electrode 20 or 21. However, the light-permeable electrode 10 may instead be formed to overlay the wire-bonding electrode 20 or 21.

Figure 4:
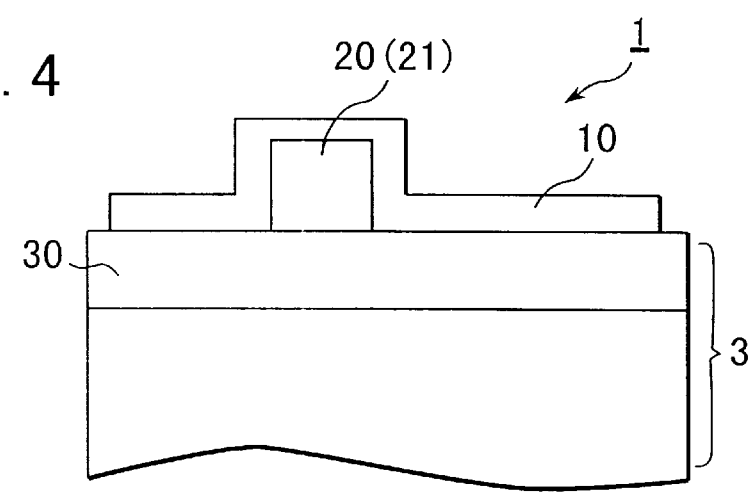
FIG. 4 shows the whole of the upper surface of the wire-bonding electrode of FIG. 3 overlaid by the light-permeable electrode.

FIG. 4 shows as arrangement in which the entire upper surface of the wire-bonding electrode is overlaid by the light-permeable electrode. By forming the light-permeable electrode 10 to cover the entire upper surface of the wire-bonding electrode 20, as shown in the drawing, the light-permeable electrode 10 that formerly only contacted the side peripheral surface of the wire-bonding electrode 20, now contacts all of the outside of the wire-bonding electrode 20 except for the bottom surface, producing a major improvement in the adhesion between the light-permeable electrode 10 and the wire-bonding electrode 20. As a result, even if there is low adhesion between the material used to form the light-permeable electrode 10 and the material used to form the wire-bonding electrode 20, peeling or turning-up of the light-permeable electrode 10 from the wire-bonding electrode 20 can be prevented.

Also, even if some deviation of the pattern arises during mask alignment, since light-permeable electrode covers all of the wire-bonding electrode except the bottom surface thereof, the contact between the light-permeable electrode 10 and the wire-bonding electrode 20 is not affected.

Moreover, since the light-permeable electrode 10 presses the wire-bonding electrode 20 down toward the semiconductor 30, the adhesion between the wire-bonding electrode 20 and the semiconductor 30 is increased, also preventing the wire-bonding electrode 20 from separating from the semiconductor 30.

As described above, when the light-permeable electrode 10 is to be formed to cover the entire upper surface of the wire-bonding electrode 20, if the light-permeable electrode 10 is formed of a material having good bonding ball fusability, that is, good bonding properties, such as Au or Al, the wire-bonding electrode 20 and the portion of the light-permeable electrode 10 on top of the wire-bonding electrode 20 can be regarded as an integrated wire-bonding electrode 20, and the upper surface thereof used for the bonding.

Figure 5:
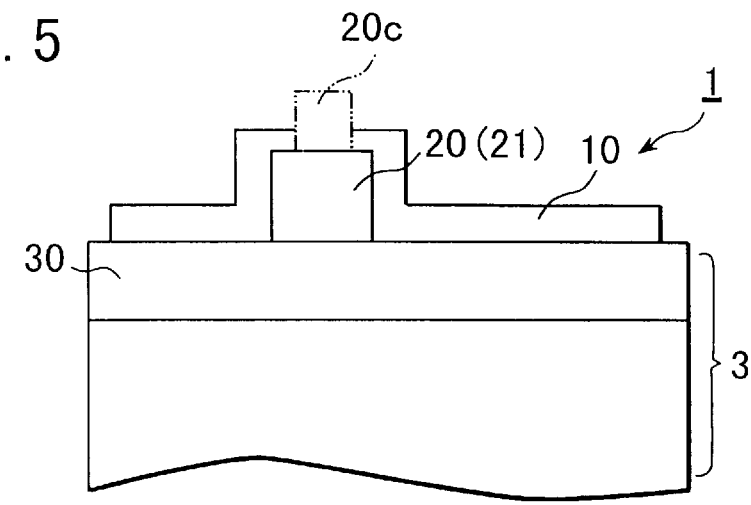
FIG. 5 shows the peripheral portion of the upper surface of the wire-bonding electrode of FIG. 3 overlaid by the light-permeable electrode.

On the other hand, if the light-permeable electrode 10 is formed of a material having poor bonding properties, an arrangement such as that shown in FIG. 5 can be used in which a portion of the light-permeable electrode 10 corresponding to the center portion of the wire-bonding electrode 20 is removed, leaving just the part of the light-permeable electrode 10 around the periphery of the upper surface of the wire-bonding electrode 20, whereby the wire-bonding electrode 20 is exposed where the center portion of the wire-bonding electrode 20 has been removed. Bonding to the wire bonding electrode 20 is effected at the exposed portion. Or, the exposed portion may be laminated with a material having good bonding properties, such as Au or Al, forming a laminated portion 20c that can be regarded as an integral part of the wire-bonding electrode 20, allowing the upper surface of the laminated portion 20c to be used for the bonding.

Using such an arrangement makes it possible to ensure good bonding properties, even when the light-permeable electrode 10 is formed of a material having poor bonding properties. Moreover, even if the portion of the light-permeable electrode 10 is removed, there is still the light-permeable electrode 10 left in contact around the upper surface of the wire-bonding electrode 20, so when the light-permeable electrode 10 is overlaid on the wire-bonding electrode 20, the prevention of separation, the reduction of the effect of pattern misalignment and other such effects can be maintained.

The use of a two-layer formation for the light-permeable electrode 10 will now be explained.

Figure 6:
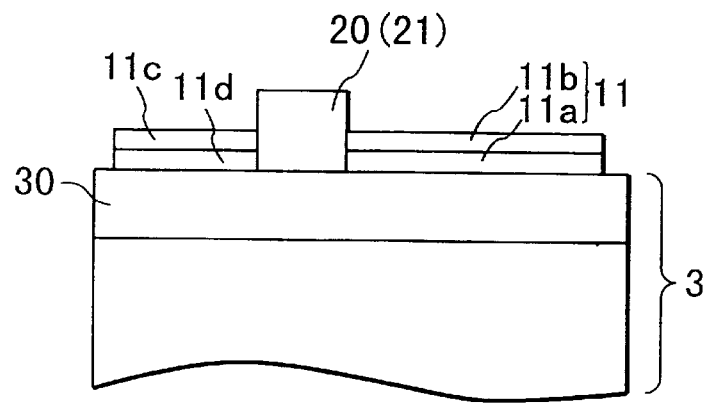
FIG. 6 shows the two-layer structure of the light-permeable electrode of the present invention.

FIG. 6 shows a light-permeable electrode with a two-layer structure. In FIG. 6, light-permeable electrode 11 consists of a first layer 11a of a light-permeable metal formed on the surface of the semiconductor 30, and a second layer 11b that contains a light-permeable metal oxide, formed on the first layer 11a.

The first layer 11a that contacts the p-type semiconductor 30 may be formed of a metal that when heat-treated provides good ohmic contact, said metal selected from a first group consisting of Au, Pt and Pd. The first layer 11a may also be formed of an alloy of at least two of the metals of the first group.

To achieve good ohmic contact, an alloy obtained by adding a slight amount of at least one metal as an impurity, such as Zn, Ge, Sn, Be or Mg, to the above-described metal may be used.

The metal oxide contained in the second layer 11b is an oxide having relatively good light permeability and superior adhesive property to the first layer 11a, and an oxide of at least one metal selected from a second group consisting of Ni, Ti, Sn, Cr, Co, Zn, Cu, Mg and In may be used. Of these, NiO, $TiO_2$, SnO, $Cr_2O_3$, CoO, ZnO, $Cu_2O$, MgO, $In_2O_3$, which are widely known to be light-permeable, and those mainly comprising an oxide where the above-described metal oxide and another metal element are present together, are useful. It is also preferable to use an oxide having good adhesive property to the backing of the first layer 11a.

The term "metal oxide" as used in the present invention refers to a mixture of oxides different in the oxidation number of the metals and includes the case where a metal not oxidized is contained. A metal that is not oxidized may be included among these. The second layer is characterized by the exercise of light permeability and, accordingly, it is of course advantageous that, of the oxides differing in composition, the most light-permeable material is used as the main component.

This is described below, taking Ni as an example. Known oxides of Ni include NiO, $Ni_2O_3$, $NiO_2$ and $Ni_3O_4$. Any of these or a mixture thereof may be used as the composition of the material constituting the second layer 11b. Or, Ni itself, which is a non-oxidized metal, may be contained. However, of these several kinds of oxides, NiO is known to exert most effectively the light permeability and a second layer comprising NiO as a main component is therefore advantageous.

In conventional light-permeable electrodes formed of a very thin single layer of metal film, heat treatment to realize ohmic contact with the backing (semiconductor) causes a phenomenon called "ball" that coagulates the metal into a sphere due to the fact that surface tension of the metal is larger than the adhesion thereof to the backing. This ball-up phenomenon produces gaps and cracks here and there in the thin metal film, resulting in loss of electrical connection and loss of function as a light-permeable electrode.

It can be considered as a means for preventing the ball-up phenomenon that the thickness of the metal electrode is increased. However, this induces the reduction of transmittance, resulting in that the electrode will lose its transmission properties.

Therefore, one of the object of the present invention is to provide a light-permeable electrode for a light-emitting semiconductor device having transmission properties and a structure capable of effectively preventing the ball-up phenomenon, and a method for the fabrication of the light-permeable electrode.

Thus, in the arrangement of this embodiment the light-permeable electrode 11 is formed as a lamination comprised of the second layer 11b formed of a metal oxide laminated on the first layer 11a of metal formed on the semiconductor 30. This makes it possible to prevent the ball-up phenomenon that occurs when a conventional single-layer structure is used. Thus, it is possible to achieve a major improvement in ohmic properties between the light-permeable electrode 11 and the semiconductor 30, and a major increase in the two-way bonding strength can also be achieved.

Furthermore, since the second layer 11b is constituted of metal oxide, good permeability can be imparted to provide the whole of the light-permeable electrode 11 with superior permeability.

The first layer 11a comprising a metal and the second layer 11b comprising a light-permeable metal oxide each preferably has good adhesive properties. For this, the electrode preferably has a structure such the oxygen composition gradually decreases from the second layer 11b toward the first layer 11a in the region near the interface between the second layer 11b and the first layer 11a, so that the composition undergoes a continuous change from the composition containing a metal oxide to the composition comprising a metal.

In order to attain high adhesion between the first layer 11a and the second layer 11b, the first layer 11a preferably contains a metal component of the metal oxide contained in the second layer 11b. The component of the second layer 11b may be contained in the first layer 11a in a constant concentration throughout the first layer 11a or the concentration may have a gradient such that the concentration is reduced along the direction from the interface 11c with the second layer 11b toward the surface of the semiconductor 30. The component of the second layer 11b may be contained in the entire first layer 11a or may be contained in only a part of the interface 11c side with the second layer 11b.

The first layer 11a is preferably formed to have a thickness of from 1nm to 500 nm so as to obtain light permeability. It is preferable to adjust the layer thickness so as to attain a light transmittance calculated from the coefficient of absorption as a physical property value inherent to a metal of from 10% to 90%.

The second layer 11b preferably has a thickness of from 1 nm to 1000 nm where light permeability is realized, an excellent ball-up prevention effect is achieved and good light permeability is attained. It is preferable to ensure that the light-permeable electrode 11 comprised of the first layer 11a and the second layer 11b has a transmittance of at least 10%, and more preferably at least 30%.

The above two-layer light-permeable electrode 11 can be produced by either of two methods. The first method comprises using ordinary resistance heating deposition, electron-beam heating deposition, sputtering or other such method to form the lower layer of metal of the first group and the upper layer of metal of the second group. At this stage the thin film comprising each of the two layers has a dark color with a metallic luster.

Next, heat treatment in an atmosphere containing oxygen is used to oxidize the upper layer comprised of a metal of the second group. An atmosphere containing oxygen refers to an atmosphere containing oxygen gas ($O_2$) or steam ($H_2O$) or the like. Through this heat treatment, the metal of the second group of which the upper layer is formed is oxidized, becoming a light-permeable metal oxide.

By means of the above procedure, there is formed, starting from the semiconductor 30 side, a light-permeable first layer 11a having good ohmic contact with the semiconductor 30, and a second layer 11b comprised of metal oxide having high light permeability, to thereby constitute the light-permeable electrode 11 having a two-layer structure.

With the first production method, the heat treatment effectively diffuses the metal of the second group used to form the metal oxide of the second layer 11b into the first layer 11a, resulting in a two-layer structure having good adhesiveness.

When metals of the first and second group are selected that are readily alloyed by heat treatment, the heat treatment in an atmosphere containing oxygen can simultaneously serve as the heat treatment used to effect oxidation of the second layer 11b to a metal oxide, and the heat treatment performed for diffusing the metal component of the second group comprising the second layer 11b into the first layer 11a. As a small amount of the metal of the second group that is diffused into the first layer 11a reaches the interface 11d between the semiconductor 30 and the first layer 11a and reacts with the layer of oxide at the surface of the semiconductor 30, it can be given the function of breaking down the oxide layer.

This can be used to effectively remove the oxide layer which degrades the properties of the contact between the semiconductor 30 and the first layer 11a and impedes the current flow. Thus, the heat treatment used to oxidize the second-group metal can at the same time serve as heat treatment for improving the properties of the contact between the light-permeable electrode 11 and the semiconductor 30.

Figure 7A:
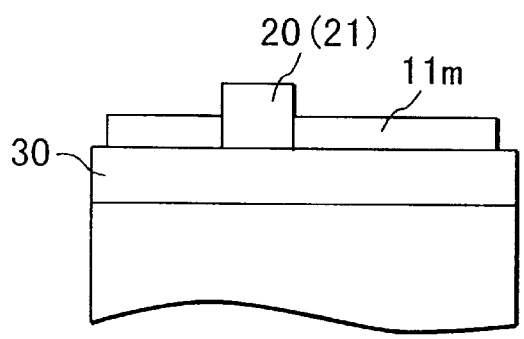
FIGS. 7(a) and 7(b) illustrate a second method of producing the two-layer light-permeable electrode of FIG. 6, with FIG. 7(a) showing the first stage and FIG. 7(b) showing the second stage.

The second method of producing a light-permeable electrode having a two-layer structure will now be described with reference to FIG. 7. First, a thin film 11m is formed on the surface of the semiconductor 30, the thin film 11m being an alloy comprising a metal of the first group having low reactivity with oxygen and a metal of the second group reacted with oxygen to form the light-permeable metal oxide (FIG. 7(a)). The thin film 11m may be formed by ordinary resistance heating deposition, electron-beam heating deposition, sputtering or other such method. At this stage the thin film 11m has a dark color with a metallic luster.

Figure 7B:
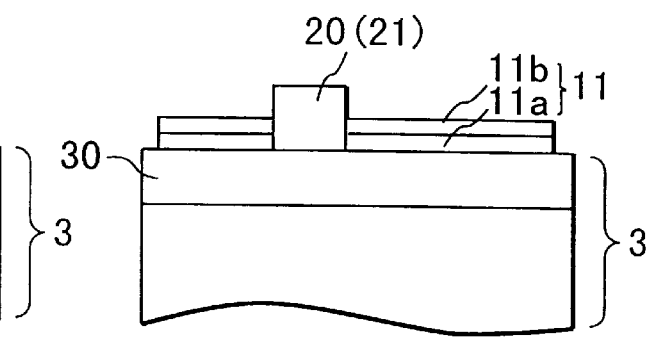

Next, with reference to FIG. 7(b), the thin film 11m is subjected to heat treatment in an atmosphere containing oxygen to induce oxidation of the metal of the second group and form a metal oxide film on the surface of the thin film 11m. As in the first production method, an atmosphere containing oxygen refers to an atmosphere containing oxygen gas ($O_2$2) or steam ($H_2O$) or the like.

This procedure produces the two-layer light-permeable electrode 11 by separating the thin film 11m into a light-permeable first layer 11a comprising a metal of the first group that is in contact with the semiconductor 30 and produces good ohmic contact, and a light-permeable second layer 11b comprising an oxide of the metal of the second group that covers the surface of the first layer 11a.

When the second production method is used, the alloy thin film 11m formed on the surface of the semiconductor 30 contains as a component the metal of the second group that is highly reactive with oxygen. So, in the heat treatment process the oxide layer on the surface of the semiconductor 30 is broken down, resulting in good electrical contact characteristics between the metal of the first group and the semiconductor 30. At the same time, the metal of the second group reacts with vapor-phase oxygen that is widely diffused on the surface of the thin film 11m, becoming a light-permeable metal oxide that fixes to the surface of the thin film 11m to form the second layer 11b. Thus, the heat treatment used to oxidize the second-group metal also serves as heat treatment for improving the properties of the contact between the light-permeable electrode 11 and the semiconductor 30.

When the second production method is used, it is desirable to select first and second group metals that can be used together as an alloy to form a thin film.

The term "alloy" as used herein refers not only to metals combined at the atomic level, but also to a blend or mixture of fine crystal grains. Thus, for example, a sputtering target consisting of a mixture of two metals can be used to adhere a mixture of crystals of two metals on a substrate even when the metals are ones that do not form an alloy when melted together. The word "alloy" as used herein also encompasses this type of mixture of fine crystals.

The mixture ratio of the metals of the first and second groups in the alloy 11m comprising the thin film 11m may be determined by calculating backward from the thickness ratios of the layers formed after the heat treatment.

In the above first and second production methods, the concentration of the oxygen in the atmosphere in which heat treatment is performed has to be determined based on the properties of the second-group metal that is to be oxidized. Based on various studies, it was found that whatever the molecules that are used to introduce the oxygen atoms, the light-permeable electrode 11 could not stably manifest light permeability if the oxygen concentration was less than 1 ppm. Therefore, it was established that it was necessary that the heat-treatment atmosphere contained at least 1 ppm oxygen.

More preferably, the oxygen content of the heat-treatment atmosphere should be lower than 25%. More than 25% oxygen can result in damage to the GaN-base compound semiconductor during the heat treatment process.

The temperature and the time of the heat treatment have to be selected in accordance with the second-group metal to be oxidized. According to studies by the present inventors, if the heat-treatment temperature is lower than 300° C., however long the heat treatment, second-group metals could not be completely and uniformly oxidized. On the other hand, at a heat-treatment temperature of 450° C. or higher, the said metals could be uniformly oxidized in less than one hour. As the metal can be stably oxidized at higher heat-treatment temperatures, any temperature over 300° C. may be used. However, a temperature should of course be used that does not cause decomposition of the semiconductor 30.

Also, no matter how high the temperature is set within the above range, complete and uniform oxidation cannot be achieved if the heat-treatment time is less than 1 minute. Accordingly, the heat treatment has to be performed for 1 minute or more.

The thin films may be heat-treated in a furnace under normal atmospheric pressure conditions or at a lower pressure. However, a pressure of at least 1 Torr is desirable. If the pressure is less than 1 Torr, it is difficult to maintain a high oxygen concentration in the furnace during the heat treatment, making it impossible to stably achieve light permeability.

The "lift-off" method may be used as the patterning method used to form the shape of the light-permeable electrode 11. Or, a method may be used comprising forming a thin metal film over the entire surface, using a resist to form a negative of the pattern on the thin metal film, and then using an etchant to etch away the exposed portions of the thin metal film.

Forming a layer of Ni on the semiconductor surface followed by a layer of Au on the Ni layer, then performing heat treatment to effect a depthwise inversion of the element distribution is an example of a known conventional method used to form a two-layer structure. This two-layer structure helps to enhance the ohmic contact with the semiconductor surface, reduce resistance and increase the bonding strength.

However, heat treatment has to be performed at a high temperature in order to effect upward migration of the Au to the surface of the electrode layer and diffusion over a wide region, and to effect inversion of the element distribution. As a consequence, it is difficult to stably control the diffusion reaction and to achieve a stable quality for the ohmic properties and light permeability required for the light-permeable electrode. In contrast, both of the above production methods of this invention can be implemented with just a slight degree of diffusion, making it possible to control the diffusion reaction at even lower temperatures, and as such can be used to achieve stable-quality light-permeable electrodes over an even wider range of heat-treatment temperatures.

As an example, the first production method was used to produce a light-permeable electrode 11 using Au for the first layer 11a and Ni for the second layer 11b, and the light-permeable electrode 11 was compared to an electrode produced by the above conventional method. The results showed that in both electrodes, transmittance right after deposition was 10%, and rose to 50% after the heat treatment at 550° C. However, when the heat-treatment temperature was lowered to 450° C., in the case of the conventional electrode the transmittance only rose to 30% after heat treatment, while in the case of the electrode produced by the first method, transmittance rose to 50% after the heat treatment.

The second production method was used to produce a light-permeable electrode 11 using a thin film 11m of a Ni—Au alloy, also for comparison with an electrode produced by the same conventional method. Again, the results showed that in both electrodes, transmittance right after deposition was 10% and rose to 50% after the heat treatment at 550° C. However, when the heat-treatment temperature was lowered to 400° C., in the case of the conventional electrode the transmittance only rose to 15% after heat treatment, while in the case of the electrode produced by the second method, the transmittance rose to 50% after the heat treatment.

Thus, using the first or second production methods in accordance with the present invention makes it possible to produce good-quality light-permeable electrodes 11 over a wider range of heat-treatment temperatures.

The arrangement comprising the light-permeable electrode 11 being formed overlaying the wire-bonding electrode 20 (21) will now be explained.

Figure 8:
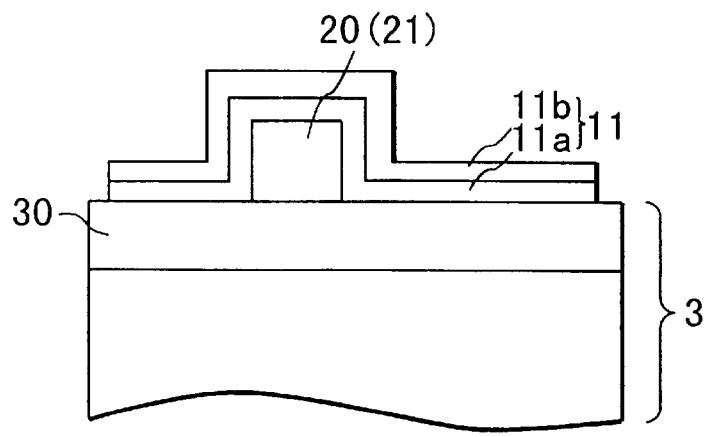
FIG. 8 shows the whole of the upper surface of the wire-bonding electrode of FIG. 3 overlaid with a two-layer light-permeable electrode.

FIG. 8 shows a two-layer light-permeable electrode 11 in which the whole of the upper surface of the wire-bonding electrode 20 is overlaid by the light-permeable electrode. Forming the light-permeable electrode 11 to cover the entire upper surface of the wire-bonding electrode 20 makes it possible to improve the adhesion between the first layer 11a and the wire-bonding electrode 20. This makes it possible to prevent the light-permeable electrode 11 turning up or peeling off from the wire-bonding electrode 20, even if there is only low adhesiveness between the material of the first layer 11a and the material of the wire-bonding electrode 20.

As in the arrangement shown in FIG. 4, any pattern deviation that might arise during the mask alignment procedure will not affect the contact between the light-permeable electrode 11 and the wire-bonding electrode 20, since the light-permeable electrode 11 covers all of the wire-bonding electrode 20 except the bottom surface thereof.

In addition, since the wire-bonding electrode 20 is pressed down toward the semiconductor 30 by the light-permeable electrode 11, the adhesion between the wire-bonding electrode 20 and the semiconductor 30 is increased, also helping to prevent the wire-bonding electrode 20 peeling away from the semiconductor 30.

Covering the wire-bonding electrode 20 with the two-layer light-permeable electrode 11 enables the following pronounced effects to be manifested. Of the first layer 11a and second layer 11b that constitute the light-permeable electrode 11, the second layer 11b becomes a metal oxide, with a lower conductivity, in the arrangement shown in FIG. 6 in which the light-permeable electrode 11 is formed around and in contact with the outside peripheral surface of the wire-bonding electrode 20, the current entering the light-permeable electrode 11 from around the wire-bonding electrode 20 only passes through the thickness portion of the first layer 11a, so the conductivity is halved. In contrast, since the light-permeable electrode 11 covers all of the wire-bonding electrode 20 except the bottom surface thereof, the area of electrical contact with the first layer 11a can be greatly expanded. This greatly improves the conductivity of the current from the wire-bonding electrode 20 into the light-permeable electrode 11, with a corresponding reduction in the resistance, enabling waste power consumption to be reduced.

As described above, when the light-permeable electrode 11 is formed to cover the entire upper surface of the wire-bonding electrode 20, if the second layer 11b of the light-permeable electrode 11 is formed of a metal oxide having good bonding properties the wire-bonding electrode and the portion of the light-permeable electrode 11 on top of the wire-bonding electrode 20 can be regarded as an integrated wire-bonding electrode 20, and the upper surface of the second layer 11b thereof used for the bonding.

Figure 9:
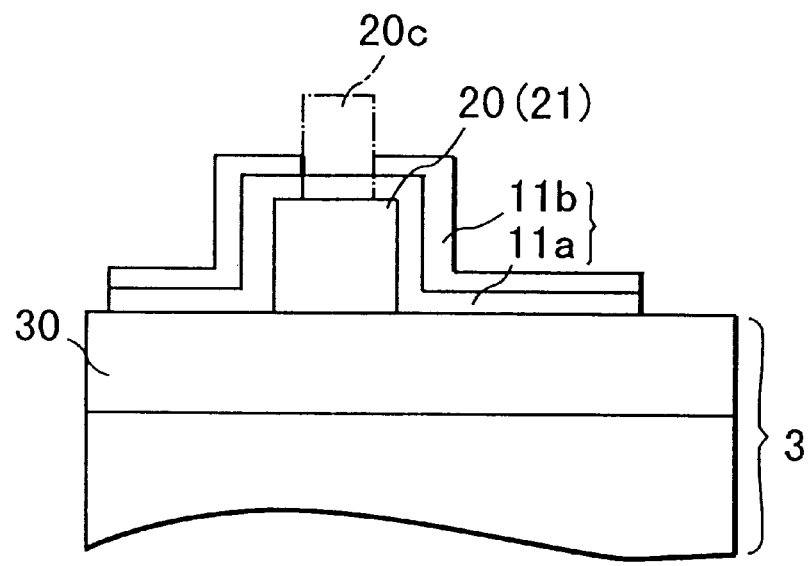
FIG. 9 shows an arrangement in which the whole of the upper surface of the wire-bonding electrode of FIG. 3 has been overlaid with a two-layer light-permeable electrode and the second layer removed.

In most cases, the metal oxide comprising the second layer 11b has poor bonding properties that make it difficult to bond onto the layer. When that is the case, an arrangement such as that shown in FIG. 9 may be used in which a portion of the second layer 11b corresponding to the center portion of the wire-bonding electrode 20 is removed, leaving just the part of the second layer 11b around the periphery of the upper surface of the wire-bonding electrode 20, exposing the first layer 11a at that portion.

If the first layer 11a is formed of a material having good bonding properties, that portion of the first layer 11a can be regarded as an integral part of the wire-bonding electrode 20, allowing the exposed upper surface of the first layer 11a to be used for the bonding. If the electrode height is not enough, Al or Au, which have good bonding properties, can be used as a laminate on the first layer 11a and the laminated portion 20c can be regarded as an integral part of the wire-bonding electrode 20 and the upper surface of the laminated portion 20c used for the bonding.

Figure 10:
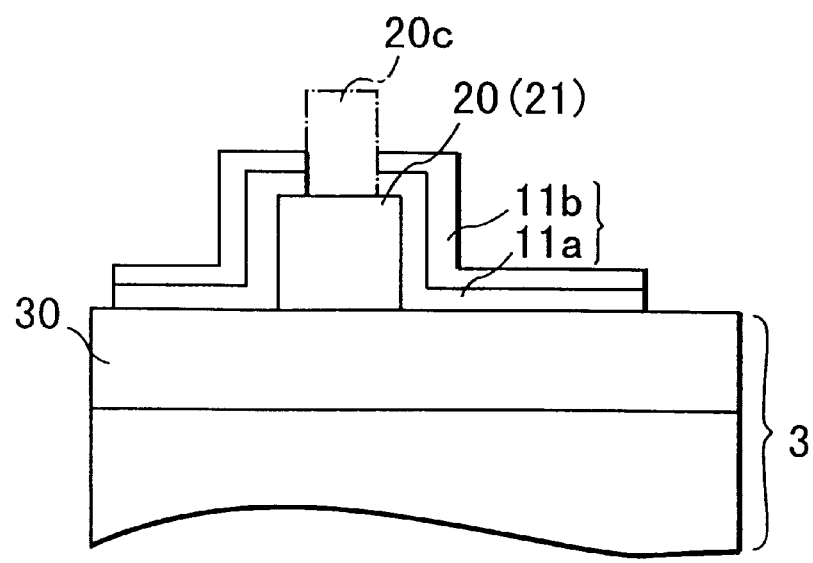
FIG. 10 shows the peripheral portion of the upper surface of the wire-bonding electrode of FIG. 3 overlaid by the two-layer light-permeable electrode.

If the first layer 11a and the second layer 11b are both formed of a material having poor bonding properties, the first layer 11a can be removed at the same time as the second layer 11b is removed, leaving just the part of the light-permeable electrode 11 that overlays the periphery of the upper surface of the wire-bonding electrode 20, as shown in FIG. 10, partially exposing the upper surface of the wire-bonding electrode 20. The exposed portion of the wire-bonding electrode 20 can be used for the bonding. Or, the exposed portion can be laminated with a material, such as Au or Al, having good bonding properties, and the laminated portion 20c then regarded as an integral part of the wire-bonding electrode 20 and the upper surface of the laminated portion 20c used for the bonding.

Using this arrangement makes it possible to ensure good bonding properties, even when the second layer 11b or both the second layer 11b and the first layer 11a are formed of a material having poor bonding properties.

Moreover, even if just the second layer 11b is removed, the first layer 11a is still left in contact around the upper surface of the wire-bonding electrode 20, so when the light-permeable electrode 11 is overlaid on the wire-bonding electrode 20, the prevention of separation, the reduction of the effect of pattern misalignment and other such effects can be maintained. Also, even if both the second layer 11b and the first layer 11a are removed, the light-permeable electrode 11 is still left in contact around the periphery of the wire-bonding electrode 20, so when the light-permeable electrode 11 is overlaid on the wire-bonding electrode 20, the prevention of separation, the reduction of the effect of pattern misalignment and other such effects can be maintained.

Examples relating to the electrode for light-emitting semiconductor devices according to the present invention will now be described. However, it is to be understood that the invention is not limited to the examples.

EXAMPLE 1

Figure 11:
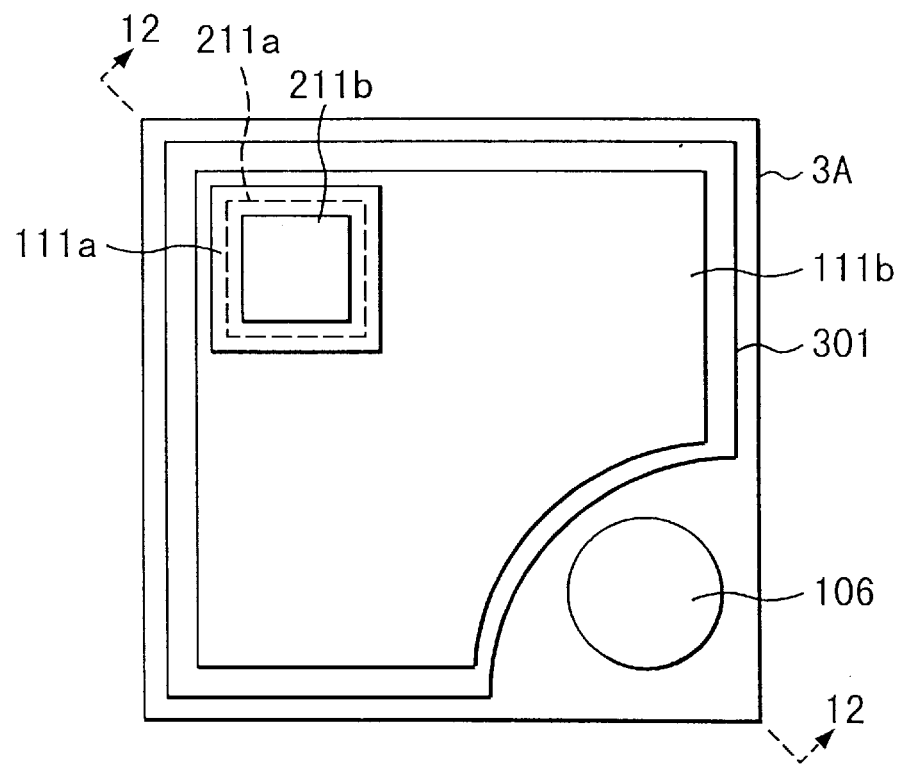
FIG. 11 is a plan view showing the arrangement of the electrode for a light-emitting device according to a first embodiment of the present invention.
Figure 12:
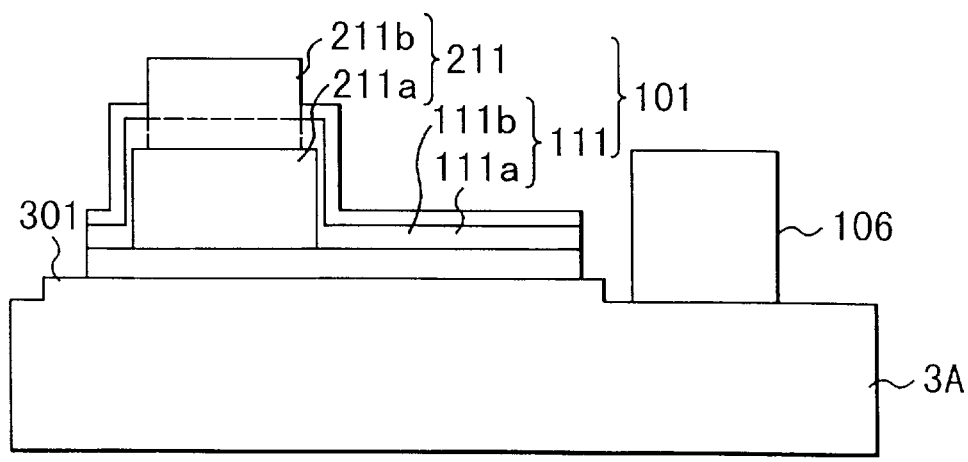
FIG. 12 is a cross-sectional view along line 12—12 of FIG. 11.

FIG. 11 is a plan view showing the arrangement of the electrode for a light-emitting semiconductor device that is a first example of the present invention, and FIG. 12 is a cross-sectional view along line 12—12 of FIG. 11. In the drawings, an electrode 1A for a light-emitting semiconductor device (hereinafter also referred to simply as "device electrode") is disposed on a laminate body 3A. The device electrode 1A and the laminate body 3A constitute a light-emitting device. The device electrode 1A comprises a p-type electrode 101 and an n-type electrode 106.

The laminate body 3A comprises a sapphire substrate having laminated thereon an AlN buffer layer, an n-type GaN layer, an InGaN layer, a p-type AlGaN layer and a p-type GaN layer 301, in that order. The p-type electrode 101 was formed on the laminate body 3A by the following procedure.

First, a known photolithography technology was used to form an AuBe layer 211a of a wire-bonding electrode 211 on the p-type GaN layer 301.

To form the wire-bonding electrode 211 (AuBe layer 211a), first the laminate body 3A was placed in a vacuum deposition apparatus (not shown) in which AuBe initially containing 1% by weight of Be was deposited to a thickness of 500 nm over the whole surface of the p-type GaN layer 301 at a pressure of $3\times10^{-6}$ Torr to thereby form a thin film of AuBe. The laminate body 3A on which the AuBe thin film was deposited was then removed from the vacuum deposition apparatus and a normal photolithography technique used to form a resist-based positive pattern of a wire-bonding electrode comprising a resist. The laminate body 3A was then immersed in Au etching agent to remove the exposed portions of the AuBe thin film, thereby forming the AuBe layer 211a.

In accordance with the following procedure, a light-permeable electrode 111 having a two-layer structure was formed by forming a first layer 111a of Au on the p-type GaN layer 301 and forming a second layer 111b of NiO on the first layer 111a.

Photolithography was then used to form a resist-based negative pattern of the light-permeable electrode 111 on the laminate body 3A on which the wire-bonding electrode 211 had been completed. Next, the laminate body 3A was placed into the vacuum deposition apparatus, in which, first, a 20 nm thickness of Au was formed on the p-type GaN layer 301 under a pressure of $3\times10^{31}$ $^{6}$ Torr, and was followed by deposition formation of 10 nm of Ni in the same apparatus. The laminate body 3A, on which the Au and Ni had been deposited, was then removed from the vacuum deposition apparatus and treated by an ordinary lift-off procedure to form a two-layer thin film of Au and Ni in a desired shape.

The laminate body 3A was then heat treated in an annealing furnace at a temperature of 550° C. for 10 minutes in an atmosphere of flowing argon containing 1% of oxygen gas. When the laminate body 3A was removed from the furnace, the two thin films 111a and 111b of Au and Ni on the laminate body 3A were a dark bluish gray and exhibited light permeability. This was how the two-layer light-permeable electrode 111 was formed. This heat treatment simultaneously served as a heat treatment for obtaining ohmic contact between the light-permeable electrode 111 and the p-type GaN layer 301, and as a heat treatment for improving the adhesion between the wire-bonding electrode 211 (AuBe layer 211a) and the p-type GaN layer 301.

The light-permeable electrode 111 thus fabricated by the above method exhibited a transmittance of 45% in the case of light with a wavelength of 450 nm. This transmittance was measured on a sample that was identical in structure with the fabricated light-permeable electrode 111 but was formed into a size suitable for measurement.

Figure 13:
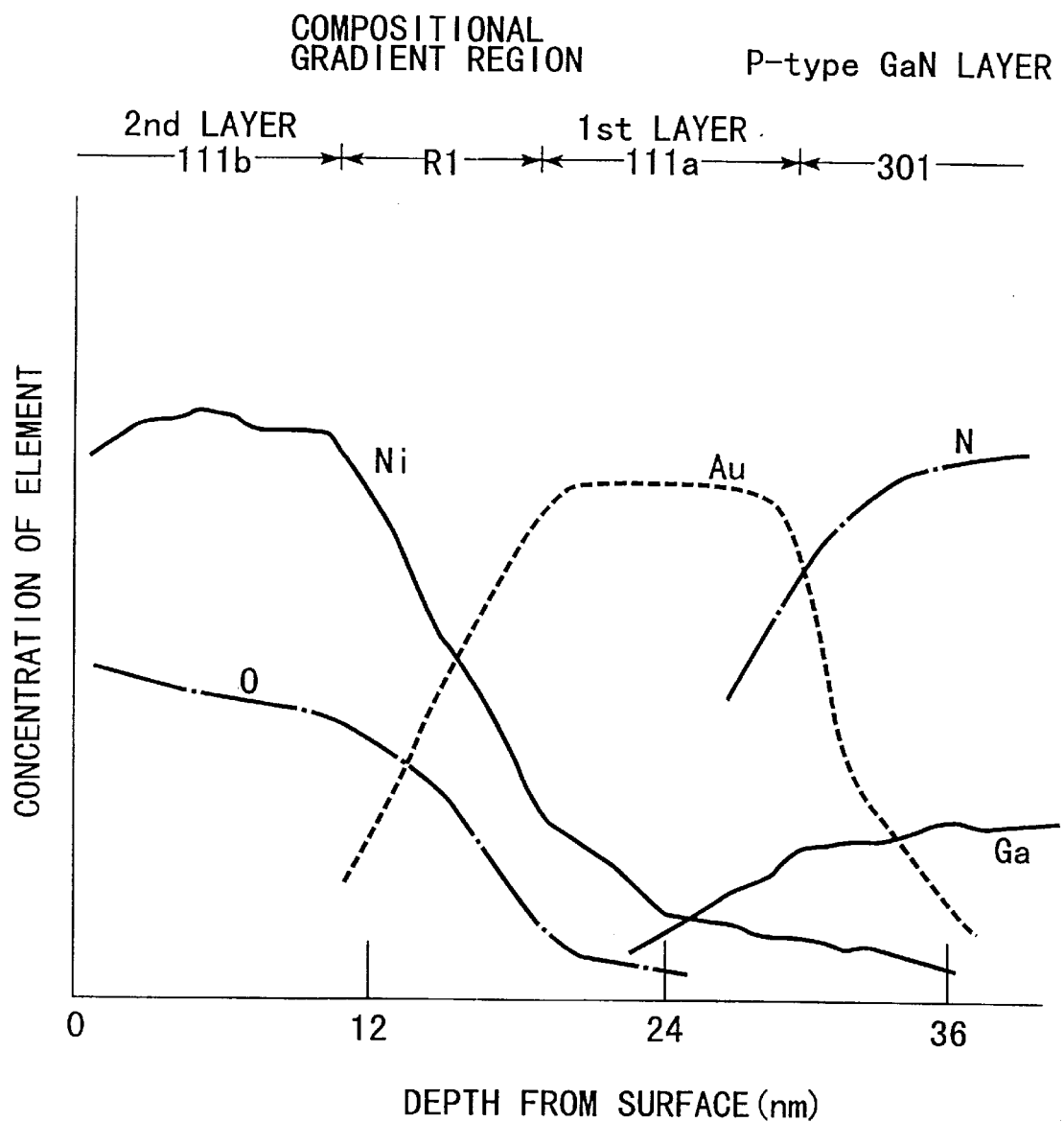
FIG. 13 is a view showing the depth profile of respective elements of the light-permeable electrode of the first embodiment, measured by Auger Electron Spectroscopy.

Auger Electron Spectroscopy (AES) was used to analyze components in the depth direction of the light-permeable electrode 111. This showed that there was not a large difference in the thickness of the light-permeable electrode 111 between before and after the heat treatment, but the AES revealed that a large amount of oxygen was taken up by the second layer 111b, giving rise to oxidation of the Ni. FIG. 13 is a depth-direction profile of the respective elements of the electrode, as measured by the AES.

The profile of the electrode composition in the depth direction shown by FIG. 13 reveals that the second layer 111b is comprised of an oxide of Ni containing Ni and oxygen, that the first layer 111a is comprised of Au with a slight Ni content, and that there is a compositional gradient region R1 in the region near the interface between the first layer 111a and the second layer 111b where the oxygen concentration gradually decreases going toward the substrate.

Figure 14:
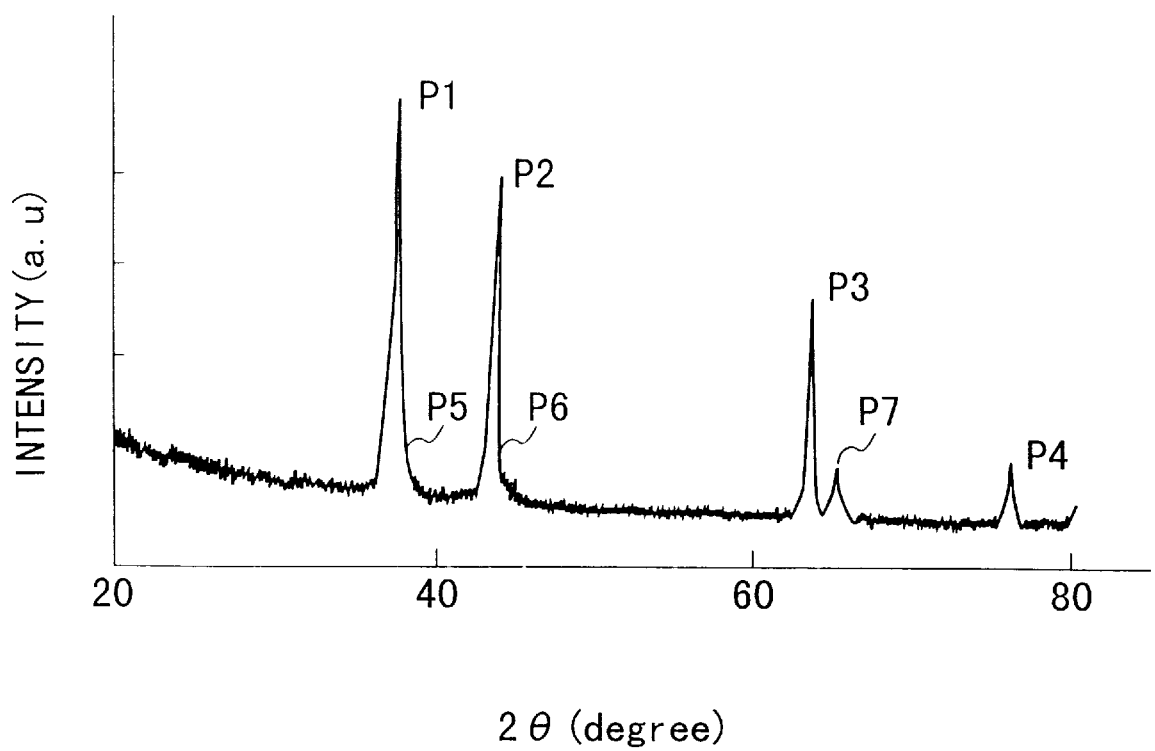
FIG. 14 is a thin-film XRD spectrum of the second layer of the light-permeable electrode of the first embodiment.

The second layer 111b was evaluated using thin-film X-ray diffraction (XRD) and found to have the spectrum shown in FIG. 14. From the peak positions, peaks P1, P2, P3 and P4 are known to correspond to the diffraction from, respectively, the (111), (200), (220) and (311) faces of the NiO, revealing that the second layer 111b is comprised of randomly-oriented crystals of NiO. Also detected in the spectrum was a weak diffraction peak P6 from the (111) face of the Ni. Diffraction peaks P5 and P7 from the Au (111) and (220) faces forming the first layer 111a were also found. This is seen as indicating that there is an aggregation of NiO crystal grains in which is mixed a small amount of Ni crystal grains. Thus, it could be verified that the second layer 111b is comprised of NiO and a small amount of Ni.

Next, known photolithography technology was used to form a pattern resist to expose a portion of the wire-bonding electrode 211 (AuBe layer 211a). The laminate body 3A was then immersed in concentrated hydrochloric acid to remove the exposed portion of the NiO layer. In this way, the NiO of the second layer 111b was removed in a region of the AuBe layer 211a, thereby exposing the Au layer constituting the first layer 111a.

The laminate body 3A was then placed in a vacuum deposition apparatus and vacuum deposition used in the same manner as in the deposition of the AuBe layer 211a to form an Au layer having a thickness of 500 nm. This vapor deposition process produced fusion with the first layer 111a constituting the backing, integrating the Au vapor-deposited this time with the Au of the first layer 111a. The laminate body 3A was removed from the apparatus and treated by a lift-off procedure, thereby completing the wire-bonding electrode 211 having a structure comprised of, from the laminate body 3A side, AuBe layer 211a and Au layer 211b.

Thus, the p-type electrode 101 was formed comprising the light-permeable electrode 111 and the wire-bonding electrode 211. The Au used for the first layer 111a is a metal that provides a good ohmic contact with the p-type GaN layer 301. The presence of the NiO used to form the second layer 111b could prevent the ball-up phenomenon from occurring. The AuBe layer 211a is an alloy that forms a high-resistance contact with the p-type GaN layer 301.

Dry etching was then used to partially expose the n-type GaN layer of the laminate body 3A in order to form an n-type electrode 106, and the n-type electrode 106 of Al was then formed on the exposed area and heat-treated to effect ohmic contact of the n-type electrode 106.

The wafer provided with device electrodes 1A having p-type electrodes 101 and n-type electrodes 106 was then cut into 400-µm-square chips that were mounted on a lead frame and connected to the leads to thereby form light-emitting diodes. The light-emitting diode exhibited an emission output of 80 µW at 20 mA and a forward voltage of 2.8 V. There was no peeling of the wire-bonding electrode 211 during the bonding process. Sixteen thousand chips were obtained from the wafer measuring two inches in diameter. Chips with an emission intensity of less than 76 µW were removed, resulting in a yield of 98%.

EXAMPLE 2

Figure 15A:
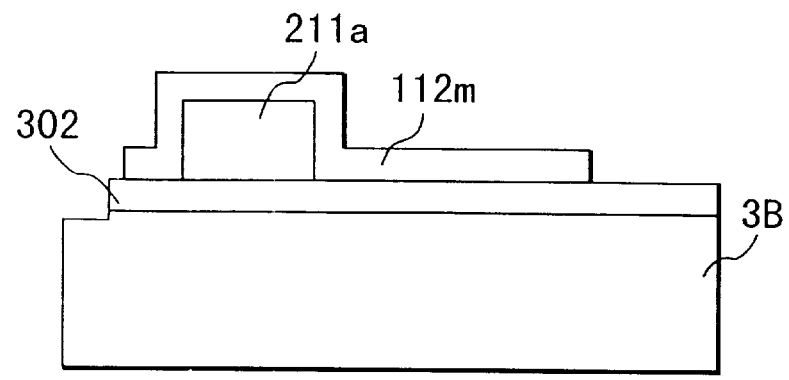
FIGS. 15(a)–15(c) are cross-sectional views showing the structure of the electrode for a light-emitting device according to a second embodiment of the present invention, with FIG. 15(a) showing the first stage, FIG. 15(b) showing the second stage, and FIG. 15(c) showing the finished state.
Figure 15B:
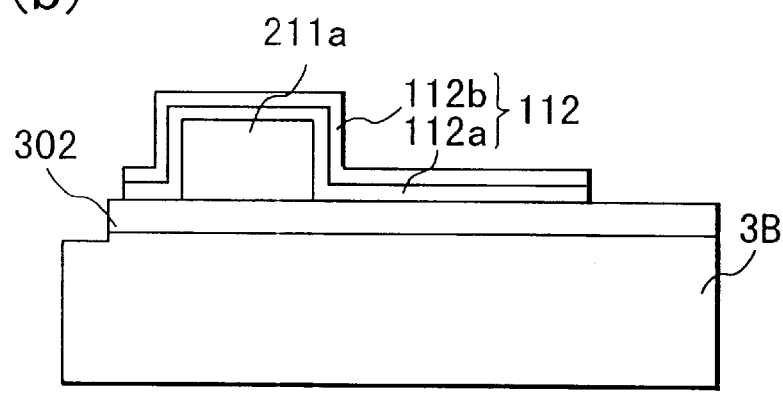
Figure 15C:
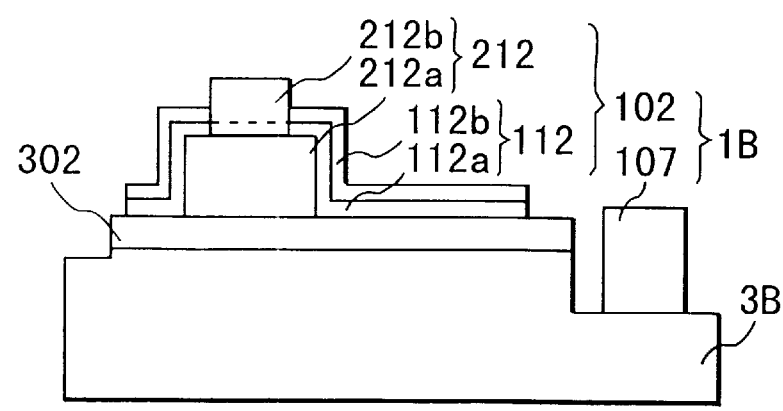

FIG. 15 is a cross-sectional view showing the structure of the device electrode that is a second example of the present invention, with FIG. 15(a) showing the first stage, FIG. 15(b) showing the second stage, and FIG. 15(c) showing the finished state. The difference between the first and second examples is that the two-layer device electrode 112 of the second example is formed as a single-layer alloy thin-film layer 112m.

The device electrode 1B of this example is disposed on a laminate body 3B having the same structure as the laminate body 3A of the first example. The device electrode 1B and the laminate body 3B constitute a light-emitting device. The device electrode 1B comprises a p-type electrode 102 and an n-type electrode 107.

The following procedure is used to form the p-side electrode 102 on the p-type GaN layer 302 disposed on the laminate body 3B.

First, a known photolithography technique was used to form a 500-nm-thick AuBe layer 212a of a wire-bonding electrode 212 on the p-type GaN layer 302.

The alloy thin-film layer 112m comprised of an alloy of Au and Ni was formed just at the region where the light-permeable electrode 112 is formed on the p-type GaN layer 302, as follows (FIG. 15(a)).

First, the laminate body 3B was placed in a vacuum deposition apparatus in which an alloy of Au and Ni was deposited on the p-type GaN layer 302 under a pressure of $3 \times 10^{-6}$ Torr. For this process, pieces of Au and Ni were placed on a resistance-heating tungsten boat in the volumetric ratio Au:Ni=2:1. After the boat was heated by the passage of a current, it was confirmed that the metal was melted, and after waiting long enough to ensure the metals were sufficiently mixed, the shutter between the laminate body 3B and the boat was opened to start the vapor deposition and form a 30-nm-thick alloy thin-film layer 112m of AuNi.

The laminate body 3B on which the alloy thin-film layer 112m was formed was then removed from the vacuum deposition apparatus and treated in accordance with an ordinary lift-off procedure to form the alloy thin-film 112m in a desired shape, in this way forming the single-layer alloy thin-film layer 112m on the p-type GaN layer 302. Thin-film X-ray diffraction was used to confirm that the alloy thin-film layer 112m was formed of AuNi alloy. The alloy thin-film layer 112m was dark gray and had a metallic luster. Almost no light permeability was observed.

The laminate body 3B was heat-treated in an annealing furnace at a temperature of 500° C. for 10 minutes in an atmosphere of flowing argon containing 20% of oxygen gas. When the laminate body 3B was removed from the furnace, the alloy thin-film layer 112m was a dark bluish gray and exhibited light permeability, having become light-permeable electrode 112 (FIG. 15(b)).

The light-permeable electrode 112 thus fabricated by the above method exhibited a transmittance of 45% with respect to light with a wavelength of 450 nm. Measurement of the transmittance and the thin-film X-ray diffraction measurement described below were taken using light-permeable electrodes 112 formed to a size suitable for measurement applications.

Figure 16:
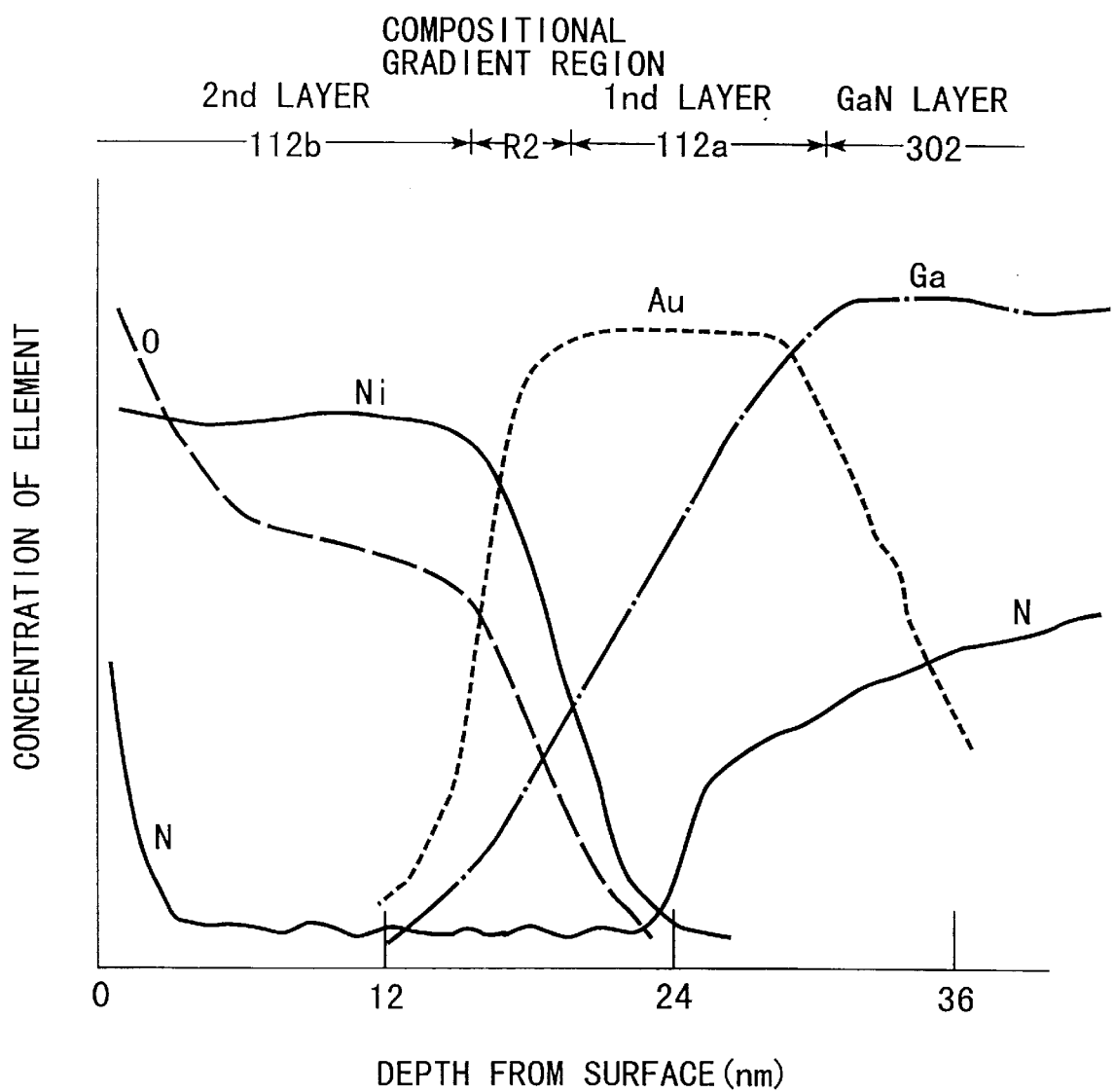
FIG. 16 is a view showing the depth profile of respective elements of the light-permeable electrode of the second embodiment, measured by Auger Electron Spectroscopy.

AES was used to measure the profile of each element in the depth direction of the light-permeable electrode 112. The results are shown in FIG. 16. It was found that after the heat treatment, the light-permeable electrode 112 had split into a first layer 112a comprised of substantially pure Au in contact with the p-type GaN layer 302, and the surface second layer 112b comprised of oxide of Ni. There was a compositional gradient region R2 in the region near the interface between the first layer 112a and the second layer 112b where the oxygen concentration gradually decreases going toward the substrate. It was also found that the first layer 112a comprised of Au in contact with the p-type GaN layer 302 contained substantially no Ni. Also, trace amounts of Ga were detected in the first layer 112a, which indicates that during the initial phase of the heat treatment, the Ni broke down a Ga oxide layer present on the surface of the p-type GaN layer 302.

On evaluating the second layer 112b after heat treatment, using thin-film X-ray diffraction, the second layer 112b was found to be comprised of NiO and a small amount of Ni.

Next, as in the first example, known photolithography technology was used to remove a portion of the second layer 112b over the wire-bonding electrode 212 (AuBe layer 212a). The laminate body 3B was then placed in a vacuum deposition apparatus and vacuum deposition was used to form an Au layer having a thickness of 500 nm, then treated using a normal lift-off procedure to thereby complete a wire-bonding electrode 212 having a multilayer structure comprised of, from the laminate body 3B side, an AuBe layer 212a and an Au layer 212b, thereby forming a p-side electrode 102 comprised by light-permeable electrode 112 and wire-bonding electrode 212.

An Al n-type electrode 107 was then formed on the exposed area and heat treated to effect ohmic contact of the n-type electrode 107.

The wafer provided with device electrodes 1B having p-type electrodes 102 and n-type electrodes 107 was then cut into 400-μm-square chips that were mounted on a lead frame and connected to the leads to thereby form light-emitting diodes. The light-emitting diodes each exhibited an illumination output of 80 μW at 20 mA and a forward voltage of 2.9 V. There was no peeling of the wire-bonding electrode 212 during the bonding process. Sixteen thousand chips were obtained from the wafer measuring two inches in diameter. Chips with an emission intensity of less than 76 μW were removed, resulting in a yield of 98%.

EXAMPLE 3

Figure 17:
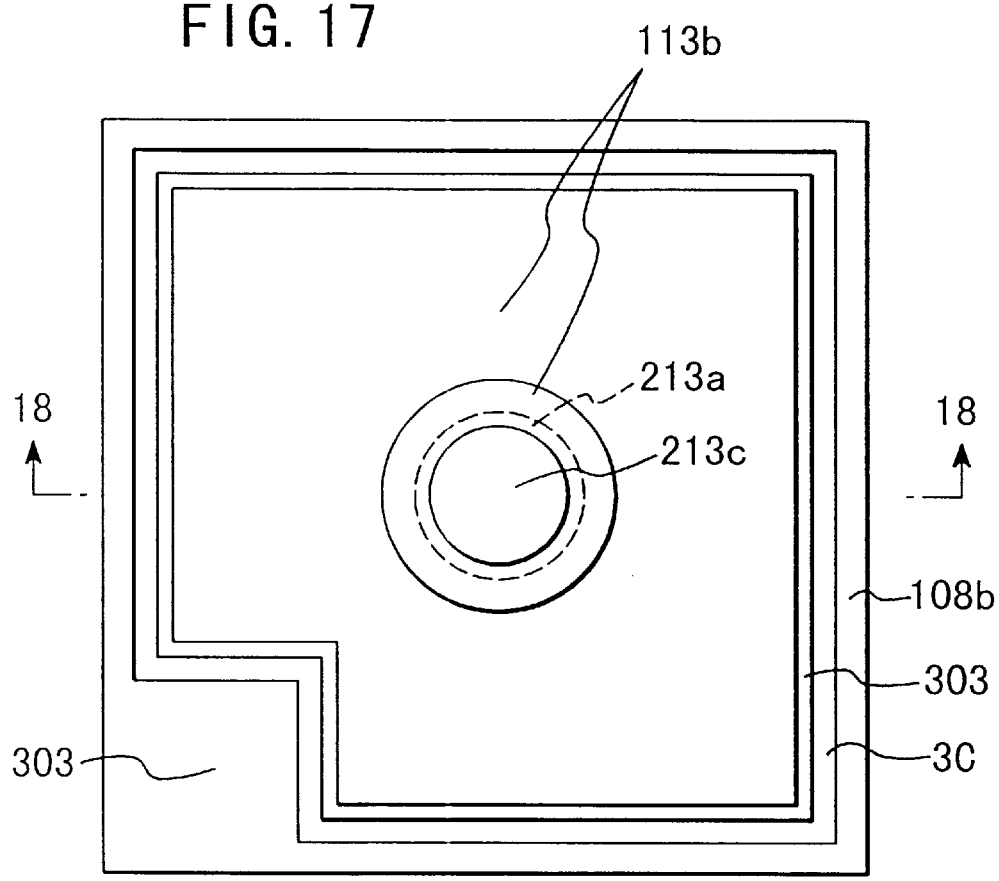
FIG. 17 is a plan view showing the arrangement of the electrode for a light-emitting device according to a third embodiment of the present invention.
Figure 18:
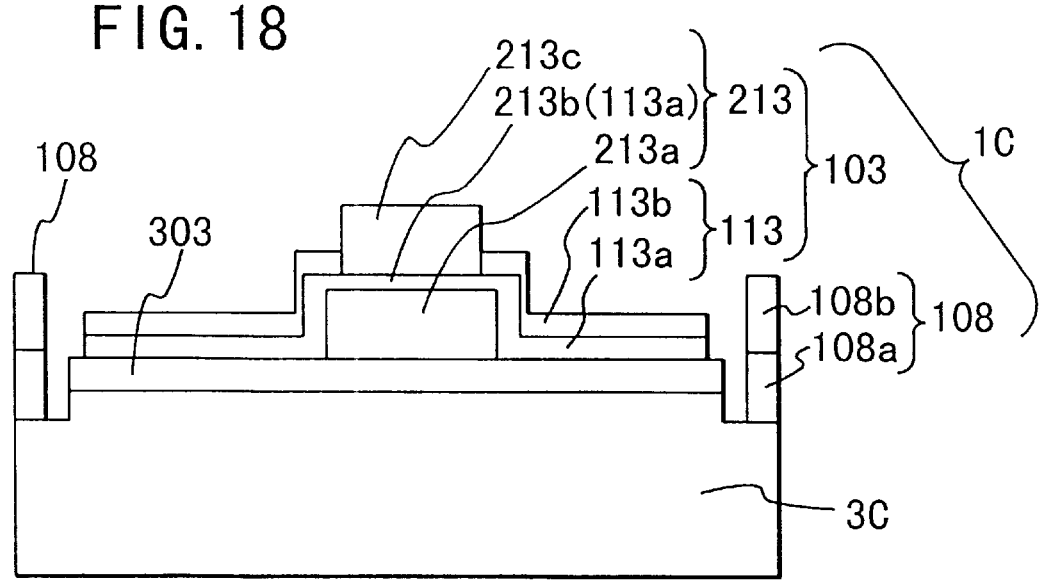
FIG. 18 is a cross-sectional view along line 18—18 of FIG. 17.

FIG. 17 is a plan view showing the arrangement of a third example of the device electrode of the present invention, and FIG. 18 is a cross-sectional view along line 18—18 of FIG. 17. The difference been this third example and the first example is that the wire-bonding electrode 213 has a three-layer structure, and layers 113a and 113b constituting the light-permeable electrode 113 are formed of Pd and SnO, respectively.

The device electrode 1C in this example is disposed on a laminate body 3C having the same structure as the device electrode 1A in the first example. The device electrode 1C and the laminate body 3C together constitute a light-emitting device. The device electrode 1C comprises a p-type electrode 103 and an n-type electrode 108.

The following procedure was used to form the p-type electrode 103 on the p-type GaN layer 303 disposed on the laminate body 3C.

First, a known photolithography technique was used to deposit Ti on the p-type GaN layer 303 to form a Ti layer 213a of the wire-bonding electrode 213. The Ti layer 213a was formed by the same method used in the first example.

The following procedure was used to form a multilayer light-permeable electrode 113 comprising a first layer 113a of Pd formed on the p-type GaN layer 303, and a second layer 113b of SnO formed on the first layer 113a.

Photolithography was then used to form a resist-based negative pattern of the light-permeable electrode 113 on the laminate body 3C on which formation of the wire-bonding electrode 213 (Ti layer 213a) had been completed. Next, the laminate body 3C was placed into the vacuum deposition apparatus, in which, first, a 5-nm-thick first layer 113a of Pd was formed on the p-type GaN layer 303 under a pressure of 3×10$^{-6}$ Torr, followed by deposition formation of a 10-nm-thick second layer 113b of Sn in the same apparatus. The laminate body 3C on which the Pd and Sn had been deposited was then removed from the vacuum deposition apparatus and treated by an ordinary lift-off procedure to form a thin film of Pd and Sn in a desired shape.

The laminate body 3C was then heat-treated at 500° C. for 60 minutes in an oxygen gas atmosphere in an annealing furnace. The heat treatment had a two-fold purpose: to oxidize the Sn of the second layer 113b to form transparent SnO, and to form an ohmic contact between the first layer 113a and the p-type GaN layer 303. With this heat treatment, the light-permeable electrode 113 was formed comprising the first layer 113a of Pd and the second layer 113b of SnO.

Then, in order to remove the portion of the SnO of the light-permeable electrode 113 overlapping the wire-bonding electrode 213 (Ti layer 213a), photolithography was used to form a pattern resist for exposing a portion of the light-permeable electrode 113 overlapping the Ti layer 213a, which was followed by immersion in acid. An acid was used that dissolved just the SnO without dissolving the Pd. In this way, in a part of the light-permeable electrode 113 that overlapped the Ti layer 213a, the second layer 113b of SnO was fully removed, exposing the first layer 113a of Pd.

Next, with the region exposed by the removal of the second layer 113b, a resist pattern was formed at another region. The laminate body 3C was placed in a vacuum deposition apparatus, and vacuum deposition was used to form an Au layer by the same procedure used to form the Ti layer 213a, the laminate body 3C was removed from the apparatus, and treated by a lift-off procedure. This left just the Au deposited on the first layer 113a exposed as the backing. This completed the wire-bonding electrode 213 having a multilayer structure in the form of, from the laminate body 3C side, Ti layer 213a, Pd layer 213b and Au layer 213c.

Thus, the p-type electrode 103 was formed comprising the light-permeable electrode 113 and the wire-bonding electrode 213. The SnO used for the second layer 113b is known as a conductive oxide, but compared to metal it has a high resistivity which makes it difficult to achieve good continuity, even when it is contacted with metal. Thus it is that at the wire-bonding electrode 213 portion, the second layer 113b is removed to improve the bonding properties. The Pd used for the first layer 113a is a metal that provides a good ohmic contact with the p-type GaN layer 303. The Ti used for the lower layer 213a of the wire-bonding electrode 213 is a metal that forms a high-resistance contact with the p-type GaN layer 303.

Dry etching was used to partially expose the n-type GaN layer of the laminate body 3C to form an n-type electrode 108, and a Ti layer 108a was formed on the exposed portion, and an Al layer 108b was formed on the Ti layer 108a, and heat treatment was used to effect ohmic contact with the n-type GaN layer, to thereby form the two-layer n-type electrode 108.

The wafer thus formed with device electrodes 1C having a p-type electrode 103 and an n-type electrode 108 was then cut into 400-μm-square chips that were mounted on lead frames and connected to the leads to form light-emitting diodes. These light-emitting diodes exhibited an illumination output of 80 μW at 20 mA and a forward voltage of 2.8 V. There was no peeling of the wire-bonding electrode 213 during the bonding process. Sixteen thousand chips were obtained from the wafer measuring two inches in diameter. Chips with an emission intensity of less than 76 μW were removed, resulting in a yield of 98%.

EXAMPLE 4

Figure 19:
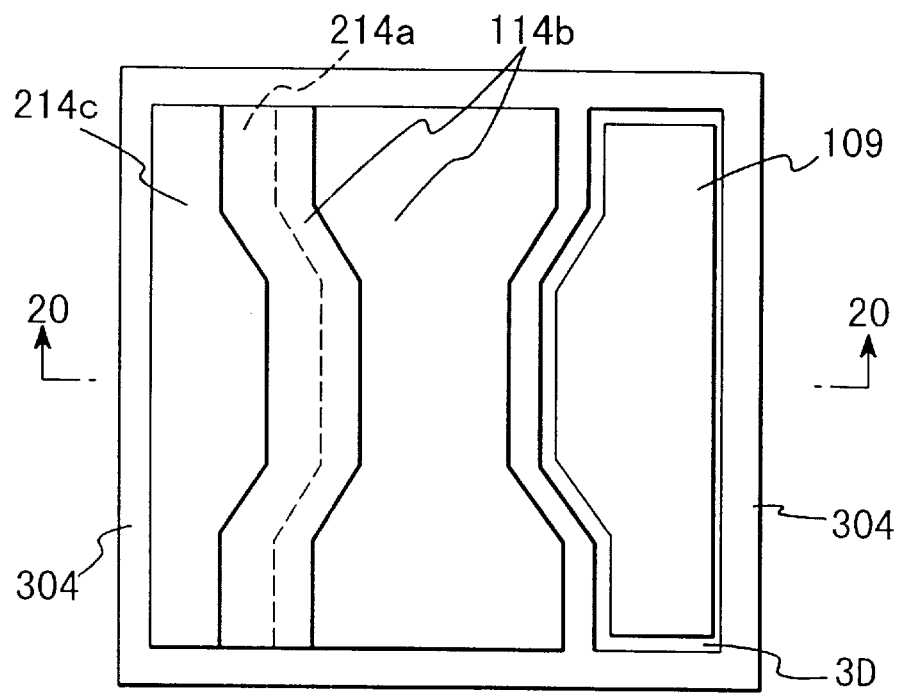
FIG. 19 is a plan view showing the arrangement of the electrode for a light-emitting device according to a fourth embodiment of the present invention.
Figure 20:
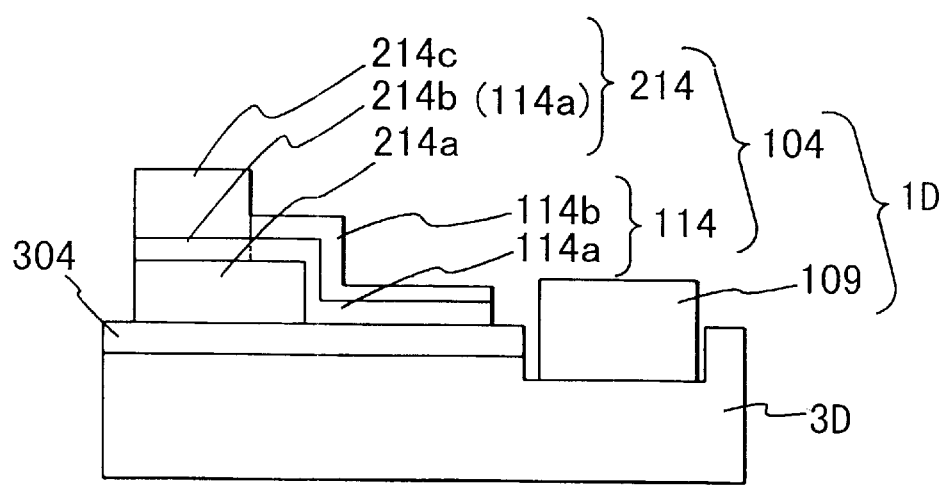
FIG. 20 is a cross-sectional view along line 20—20 of FIG. 19.

FIG. 19 is a plan view showing the arrangement of a fourth example of the device electrode according to the present invention, and FIG. 20 is a cross-sectional view along line 20—20 of FIG. 19. The wire-bonding electrode 214 of this fourth example has a three-layer structure, and the light-permeable electrode 114 is a two-layer type formed from alloy thin-film monolayers of Pt and TiO$_2$.

The device electrode 1D in this example is disposed on a laminate body 3D having the same structure as the device electrode 1A in the first example. The device electrode 1D and the laminate body 3D together constitute a light-emitting device. The device electrode 1D comprises a p-type electrode 104 and an n-type electrode 109.

The following procedure was used to form the p-type electrode 104 on the p-type GaN layer 304 disposed on the laminate body 3D.

First, a known photolithography technique was used to form a pattern of an AuBe layer 214a in the shape of the wire-bonding electrode 214 on the p-type GaN layer 304.

Photolithography and lift-off techniques were then used to form a thin-film layer of an alloy of Pt and Ti just on the region of the p-type GaN layer 304 where a light-permeable electrode 114 is formed.

With respect to the formation of the alloy thin-film layer, the laminate body 3D was placed into the vacuum deposition apparatus and, using a PtTi alloy target in which the Pt and Ti were contained in an equal volumetric ratio, a 20-nm-thick alloy thin-film layer was formed under a pressure of $3 \times 10^{-6}$ Torr. The laminate body 3D on which the PtTi alloy thin film had been deposited was then removed from the vacuum deposition apparatus and treated by an ordinary lift-off procedure to form the alloy thin film in a desired shape. In this way, a PtTi alloy thin film was formed on the p-type GaN layer 304. The thin film was silver in color, with a metallic luster, and exhibited substantially no light permeability.

The laminate body 3D was then heat-treated at 450° C. for 1 hour in a nitrogen gas atmosphere containing 10% oxygen gas in an annealing furnace. When the alloy thin film was observed by an optical microscope after the heat treatment, it was found to have turned yellowish and lost its metallic luster, and it exhibited light permeability, in becoming the light-permeable electrode 114.

The light-permeable electrode 114 thus fabricated by the above method was not changed in thickness by the heat treatment, and exhibited a transmittance of 30% with respect to light with a wavelength of 450 nm. Measurements using AES and thin-film X-ray diffraction showed that the Ti in the PtTi alloy had been oxidized, forming $TiO_2$, and had separated on the thin-film surface. That is, following the heat treatment, the light-permeable electrode 114 became a thin film having a laminate structure comprised by a first layer 114a of Pt and a second layer 114b of Ti oxide.

In order to remove the portion of the $TiO_2$ of the light-permeable electrode 114 overlapping the wire-bonding electrode 214, photolithography was used to form a pattern resist for exposing the portion of the light-permeable electrode 114 overlapping the wire-bonding electrode 214, and the laminate body 3D was then immersed in acid. An acid was used that dissolved just the $TiO_2$ without dissolving the Pt. In this way, at a part of the light-permeable electrode 114 that overlapped the wire-bonding electrode 214, the second layer 114b of $TiO_2$ was fully removed, exposing the first layer 114a of Pt.

Next, with the region exposed by the removal of the $TiO_2$, a resist pattern was formed at another region. The laminate body 3D was placed in a vacuum deposition apparatus, and vacuum deposition was used to form an Au layer by the same procedure used to form the wire-bonding electrode 214 (AuBe layer 214a). The laminate body 3D was removed from the apparatus, and treated by a lift-off procedure. This left just the Au deposited on the Pt first layer 114a exposed as the backing. This completed the wire-bonding electrode 214 having a multilayer structure comprising, from the laminate body 3D side, AuBe layer 214a, Pt layer 214b and Au layer 214c. Thus, the p-type electrode 104 was formed comprising the light-permeable electrode 114 and the wire-bonding electrode 214.

As in the first example, an Al n-side electrode 109 was formed and subjected to heat treatment to effect ohmic contact.

The wafer thus formed with device electrodes 1D having a p-type electrode 104 and an n-type electrode 109 was cut into 400-μm-square chips, which were mounted on lead frames and connected to the leads to form light-emitting diodes. These light-emitting diodes exhibited an illumination output of 80 μW at 20 mA and a forward voltage of 2.9 V. There was no peeling of the wire-bonding electrode 214 during the bonding process. Sixteen thousand chips were obtained from the wafer measuring two inches in diameter. Chips with an emission intensity of less than 76 μW were removed, resulting in a yield of 96%.

EXAMPLE 5

Figure 21:
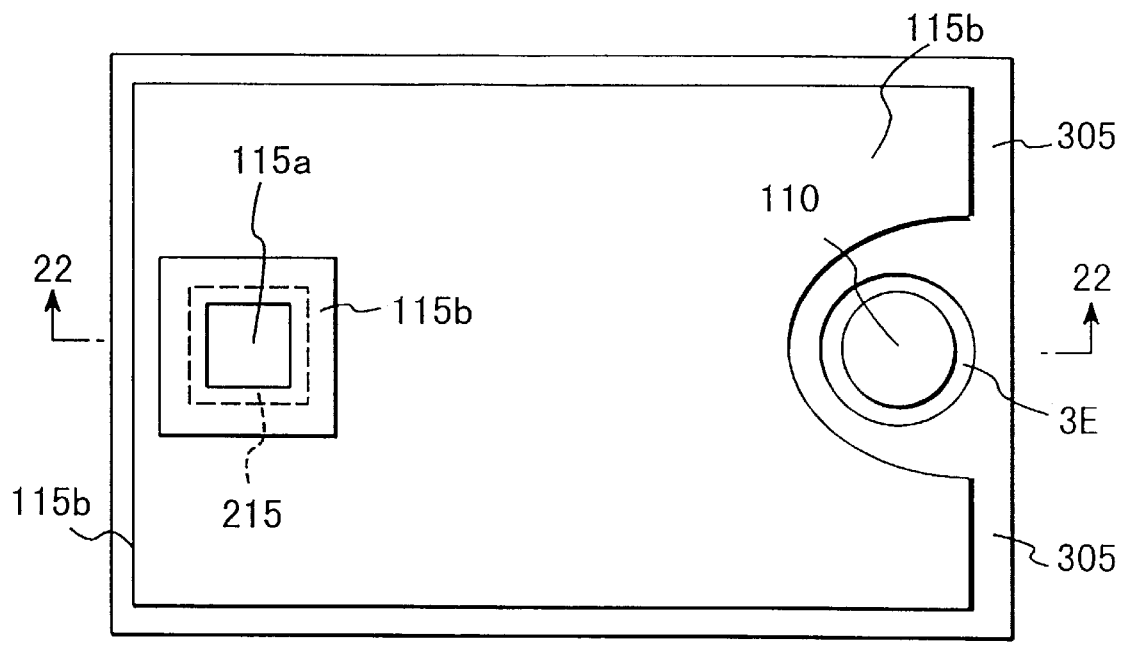
FIG. 21 is a plan view showing the arrangement of the electrode for a light-emitting device according to a fifth embodiment of the present invention.
Figure 22:
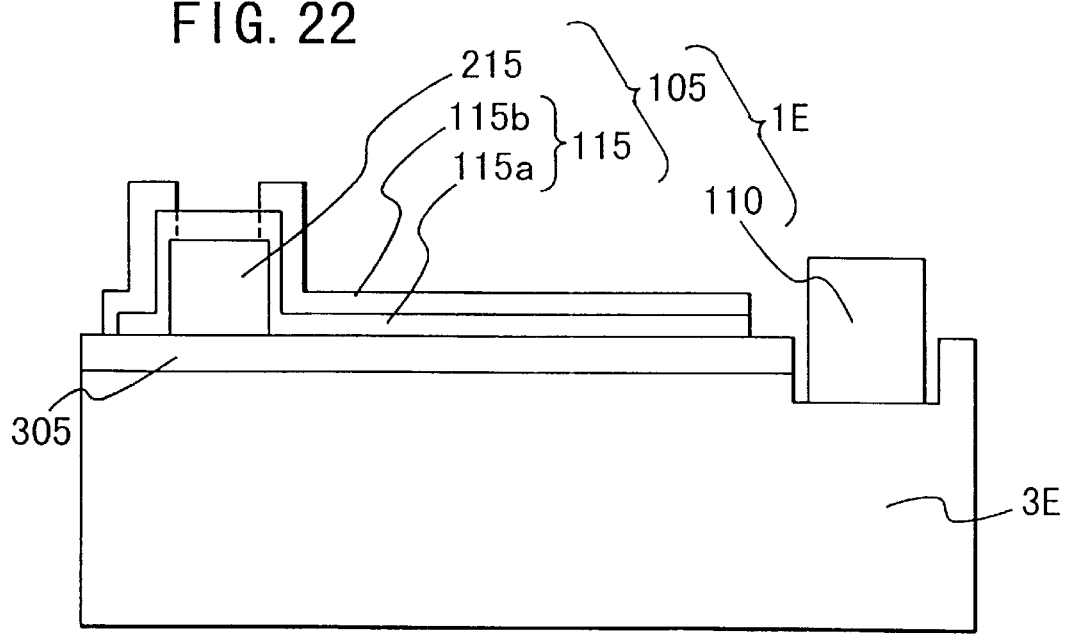
FIG. 22 is a cross-sectional view along line 22—22 of FIG. 21.
Figure 23:
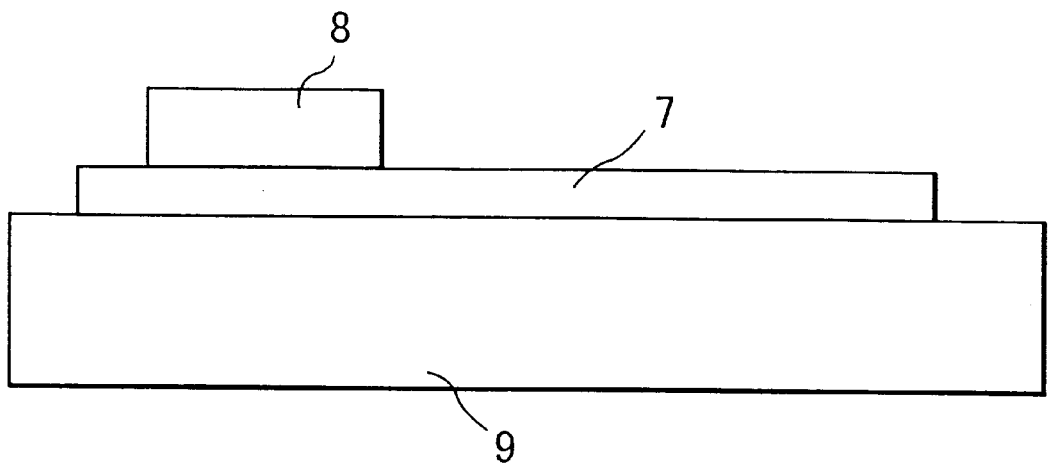
FIG. 23 is a cross-sectional view of a conventional p-type electrode.
Figure 24:
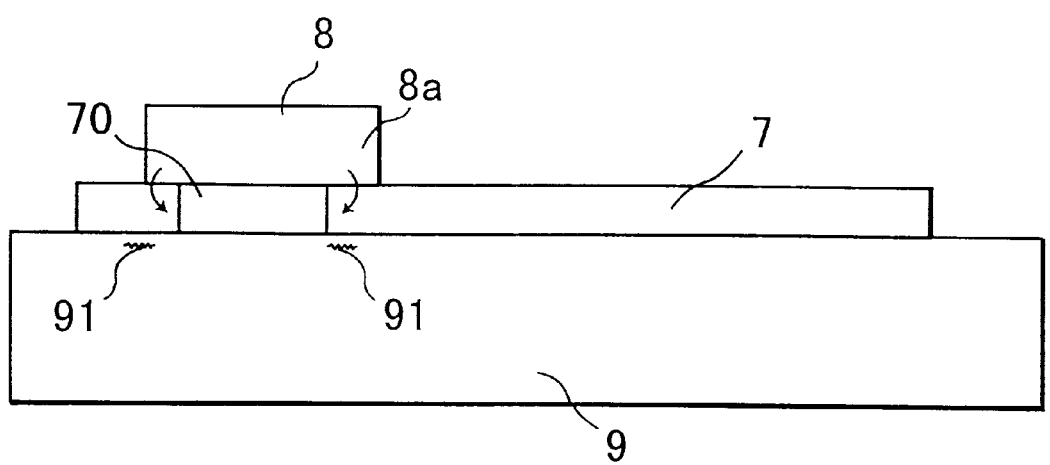
FIG. 24 is a cross-sectional view of a conventional p-type electrode with a window provided with a wire-bonding electrode.

FIG. 21 is a plan view showing the arrangement of the device electrode according to a fifth example of the present invention, and FIG. 22 is a cross-sectional view along line 22—22 of FIG. 21. In this fifth example, wire-bonding electrode 215 is formed of Al and the layers 115a and 115b constituting the light-permeable electrode 115 are formed of Au and $Cr_2O_3$, respectively.

The device electrode 1E of this example is provided on a laminate body 3E, comprising a sapphire substrate having laminated thereon an $Al_{0.8}Ga_{0.2}N$ buffer layer, an n-type GaN layer, an InGaN layer doped with Zn and Si, a p-type AlGaN layer and a p-type GaN layer 305, in that order. The device electrode 1E and the laminate body 3E together constitute a light-emitting device. Also, the device electrode 1E comprises a p-type electrode 105 and an n-type electrode 110.

The following procedure was used to form the p-type electrode 105 on the p-type GaN layer 305 disposed on the laminate body 3E.

The preprocessed laminate body 3E was placed in a vacuum deposition apparatus which was evacuated to a pressure of $3 \times 10^{-6}$ Torr, and the hearth of the electron-beam radiation heater of the apparatus was charged with Al as the source metal.

After confirming the vacuum, the Al was heated to melting. After confirming the Al had melted by electron-beam radiation, the shutter between the hearth and the semiconductor substrate jig was opened to start the Al deposition process. A quartz-oscillator type thickness gauge was used to monitor the thickness of the film. When the film thickness reached 1 μm, the deposition process was stopped.

The laminate body 3E was removed from the apparatus and photolithography was used to form a wire-bonding electrode photoresist pattern on the laminate body 3E. The laminate body 3E was then immersed in an Al etching agent to remove exposed portions not covered by the photoresist, to thereby form an Al wire-bonding electrode 215 in the desired shape, after which the photoresist was removed.

Next, photolithography was used to form a light-permeable electrode photoresist pattern on the laminate body 3E. The laminate body 3E was placed in a vacuum deposition apparatus which was set to a pressure of $3 \times 10^{-6}$ Torr, and the same procedure described above used to form a 10-nm-thick layer of Au for the first layer 115a and a 20-nm-thick layer of Cr for the second layer 115b. The laminate body 3E was then removed from the apparatus and treated by an ordinary lift-off procedure, whereby a two-layer thin film of Au and Cr was formed in a desired shape.

In an annealing furnace, the laminate body 3E was then heat-treated at 650° C. for 10 minutes in a nitrogen gas atmosphere containing 500 ppm of oxygen. The reaction with the oxygen oxidized the Cr of the second layer 115b, resulting in a light-permeable electrode 115 having a planar structure comprised of, from the laminate body 3E side, a first layer 115a of Au and a second layer 115b of $Cr_2O_3$. In order to remove the portion of the $Cr_2O_3$ of the light-permeable electrode 115 overlapping the wire-bonding electrode 215, photolithography was used to form a pattern resist for exposing the portion of the light-permeable electrode 115 overlapping the wire-bonding electrode 215, and the laminated body 3E was then immersed in hydrochloric acid to dissolve the $Cr_2O_3$ only. In this way, at a part of the light-permeable electrode 115 that overlapped the wire-bonding electrode 215, the second layer 115b of $Cr_2O_3$ was fully removed, exposing the first layer 115a of Au. The p-type electrode 105 comprising of the light-permeable electrode 115 and the wire-bonding electrode 215 was thus formed. Subsequently, the n-type electrode was formed and ohmic contact of the n-type electrode was effected. In this way, the p-type electrode 105 was formed comprising the light-permeable electrode 115 and the wire-bonding electrode 215. As in the first example, an Al n-type electrode 110 was formed and subjected to heat treatment to effect ohmic contact.

The wafer thus formed with device electrodes 1E having a p-type electrode 105 and an n-type electrode 110 was cut into 400-μm-square chips, which were mounted on lead frames and the electrodes connected to the leads using an ultrasonic wire-bonder. During the wire-bonding process, substantially no peeling of the wire-bonding electrode 215 was observed.

The chips were then encased in resin packages to form light-emitting diodes which exhibited an illumination output of 80 μW at 20 mA and a forward voltage of 2.9 V. Sixteen thousand chips were obtained from the wafer measuring two inches in diameter. Chips with an emission intensity of less than 78 μW were removed, resulting in a yield of 98%.

Conventional device electrodes were fabricated and the device electrodes of examples one to five were compared to the conventional device electrodes.

Comparative Example 1

The device electrodes of the first comparative example were provided on a laminate body having the same structure as that of the first example. First, a vacuum deposition apparatus was used to form a light-permeable electrode constituted by a single layer of Au 25 nm thick. The laminate body was subjected to heat treatment consisting of heating at 550° C. for 10 minutes in an argon atmosphere to effect ohmic contact with a p-type GaN layer. Following the heat treatment, the light permeability of the light-permeable electrode surface appeared to have increased, but the metallic luster had disappeared. A wire-bonding electrode was laminated on the light-permeable electrode. In light-emitting diodes fabricated from this semiconductor substrate, light emission was only generated directly under the wire-bonding electrode, and the light emission was not visible at the surface of the light-permeable electrode. Observation by optical microscope showed that the Au thin film constituting the light-permeable electrode had ball-shaped agglomerations and lacked continuity.

Comparative Example 2

The device electrodes of the second comparative example were provided on a laminate body having the same structure as that of the first example, and the same operations were used to form on the laminate body a layer of Au, and an NiO layer on the Au layer, to thereby form a light-permeable electrode having a two-layer structure. Unlike in the first comparative example, a window portion was formed in the light-permeable electrode at a position where the wire-bonding electrode was to be located, exposing the semiconductor substrate at that portion. A lift-off technique was then used to form on the window portion a multilayer wire-bonding electrode consisting of an AuBe layer on the semiconductor substrate side, and an Au layer on the AuBe layer. Dry etching was used to expose the n-type layer at the n-type electrode formation location. An Al n-type electrode was then formed at the exposed portion. Heat treatment was performed to form an ohmic contact for the n-type electrode.

The wafer thus formed with p-type and n-type electrodes was then cut into 400-μm-square chips that were mounted on lead frames and connected to the leads to form light-emitting diodes. These light-emitting diodes exhibited an illumination output of 50 μW at 20 mA, lower than any of the light-emitting diodes of examples one to five. At 15.0 V, the forward voltage was very high. This was caused by the metal oxide layer that forms the topmost layer of the light-permeable electrode, acting as an obstruction between the light-permeable electrode and the wire-bonding electrode.

While the inventive examples were described with reference to light-emitting diodes, the device electrode of the invention may also be applied to laser diodes.

The present invention as described in the foregoing provides the following effects.

The region of the wire-bonding electrode in contact with the semiconductor has a higher contact resistance per unit area with respect to the semiconductor than a region of the light-permeable electrode in contact with the semiconductor. This makes it possible to stop current flowing under the wire-bonding electrode so that all of the current from around the wire-bonding electrode is injected into the light-permeable electrode, contributing to the light emission action. That is, light emission does not take place under the wire-bonding electrode, and substantially all of the light emission that is generated can be emitted upward from the light-permeable electrode. Current is therefore used effectively and light emission efficiency is improved.

This electrode configuration having a wire-bonding electrode and a light-permeable electrode can be readily formed by growing thin films using a method such as vacuum vapor deposition. The process is very simple, involving just the vapor deposition of the metal material, so formation of the films can be effected rapidly. That is, current flow under the wire-bonding electrode can be securely blocked by means of a simple structure that can be readily formed without having to undertake complex processes.

The invention also comprises a wire-bonding electrode having a multilayer structure. This means that when the region of the wire-bonding electrode in contact with the semiconductor is formed of a material with high contact resistance that does not have good bonding properties, the surface of the wire-bonding electrode can be provided with a metal having good bonding properties, thereby realizing a wire-bonding electrode with a high contact resistance to the semiconductor and good bonding properties.

The device electrode of the invention also provides an arrangement in which the light-permeable electrode is comprised of a metal oxide second layer formed on the semiconductor-side metal oxide first layer. This makes it possible to prevent the balling-up that occurs with the conventional monolayer arrangement, and therefore improves the properties of the ohmic contact between the light-permeable electrode and the semiconductor surface, and strengthens the bond therebetween. As the second layer is formed of a metal oxide, good light-permeability can be imparted, resulting in a light-permeable electrode having good light-permeability throughout.

The second layer formed by metal oxide makes it possible to impart good permeability to the second layer and to realize excellent entire permeability of the light permeable electrode.

The device electrode also includes an arrangement wherein the oxygen composition gradually decreases from the second layer toward the first layer in the region near the interface between the second layer and the first layer, so the composition undergoes a continuous change from a composition containing a metal oxide to a composition comprising a metal. This results in stronger adhesion between the first and second layers.

The device electrode also includes an arrangement wherein the first layer contains a metal element which is a main component of the metal oxide constituting the second layer. This also results in stronger adhesion between the first and second layers.

The device electrode also includes an arrangement wherein the light-permeable electrode is formed to overlay an upper surface of the wire-bonding electrode. As the light-permeable electrode covers all of the outside of the wire-bonding electrode except for the bottom surface, it produces a major improvement in the adhesion between the light-permeable electrode and the wire-bonding electrode. As a result, even if there is low adhesion between the material used to form the light-permeable electrode and the material used to form the wire-bonding electrode, peeling of and turning up the light-permeable electrode from the wire-bonding electrode can be prevented.

Also, even if some deviation of the pattern arises during mask alignment, since the light-permeable electrode covers all of the wire-bonding electrode except the bottom surface thereof, the contact between the light-permeable electrode and the wire-bonding electrode is not affected.

Moreover, since the light-permeable electrode presses the wire-bonding electrode down toward the semiconductor, the adhesion between the wire-bonding electrode and the semiconductor is increased, also preventing the wire-bonding electrode from separating from the semiconductor. Also, since the light-permeable electrode covers all of the wire-bonding electrode except the bottom surface thereof, the area of electrical contact with the first layer is greatly expanded. This greatly improves the conductivity of the current from the wire-bonding electrode into the light-permeable electrode, with a corresponding reduction in the resistance, enabling waste power consumption to be reduced.

If the second layer of the light-permeable electrode is formed of a metal oxide having low conductivity, the current entering the light-permeable electrode from around the wire-bonding electrode only passes through the thickness portion of the first layer in the conventional arrangement, and is therefore halved. In contrast, since the light-permeable electrode covers all of the wire-bonding electrode, sufficient continuity with the wire-bonding electrode is ensured.

The device electrode also includes an arrangement wherein the light-permeable electrode is formed to overlay a periphery of the upper surface of the wire-bonding electrode. Thus, the light-permeable electrode can be directly contacted with an exposed central portion of the wire-bonding electrode, or the exposed portion can be laminated with a material having good bonding properties. Therefore, good bonding properties can be ensured even when the second layer of the light-permeable electrode is formed of a material having poor bonding properties, or both the second layer and the first layer are formed of materials having poor bonding properties. This arrangement also makes it possible to maintain the effects of preventing peeling of the light-permeable electrode, reduction of the effect of pattern misalignment, and improvement of the strength of the adhesion between the wire-bonding electrode and the semiconductor.

The device electrode also includes an arrangement wherein the light-permeable electrode is formed to cover the entire upper surface of the wire-bonding electrode. With this arrangement, too, the prevention of separation, the reduction of the effect of pattern misalignment, the improvement of the strength of the adhesion between the wire-bonding electrode and the semiconductor and other such effects can be maintained.

The device electrode also includes an arrangement wherein the portion of the second layer of the light-permeable electrode that overlays the wire-bonding electrode is removed to expose the first layer. This enables bonding properties to be improved by laminating the portion with a material having good bonding properties. Therefore, good bonding properties can be ensured even when the second layer of the light-permeable electrode is formed of a material having poor bonding properties, or both the second layer and the first layer are formed of materials having poor bonding properties.

The device electrode also includes an arrangement in which the upper surface of the wire-bonding electrode is covered by the light-permeable electrode, so the contact between the two extends over the whole surface and only excludes the bottom surface of the wire-bonding electrode. This provides a major improvement in adhesion between the light-permeable electrode and the wire-bonding electrode. Good adhesion is therefore ensured even if the light-permeable electrode and wire-bonding electrode are formed of materials having poor adhesiveness, and it also prevents peeling of the light-permeable electrode.

Also, even if some deviation of the pattern arises during mask alignment, since the light-permeable electrode covers all of the wire-bonding electrode except for the bottom surface thereof, the contact between the light-permeable electrode and the wire-bonding electrode is not affected.

Moreover, since the light-permeable electrode presses the wire-bonding electrode down toward the semiconductor, the adhesion between the wire-bonding electrode and the semiconductor is increased, also preventing the wire-bonding electrode from separating from the semiconductor.

Also, since the light-permeable electrode covers all of the wire-bonding electrode except the bottom surface thereof, the area of electrical contact with the first layer is greatly expanded. This greatly improves the conductivity of the current from the wire-bonding electrode into the light-permeable electrode, with a corresponding reduction in the resistance, enabling waste power consumption to be reduced.

The device electrode also includes an arrangement wherein the light-permeable electrode is formed to overlay a periphery of the upper surface of the wire-bonding electrode. Thus, the light-permeable electrode can be directly contacted with an exposed central portion of the wire-bonding electrode, or the exposed portion can be laminated with a material having good bonding properties. Therefore, good bonding properties can be ensured even when the light-permeable electrode is formed of a material having poor bonding properties. This arrangement also makes it possible to maintain the effects of preventing peeling of the light-permeable electrode and reduction of the effect of pattern misalignment.

The device electrode also includes an arrangement wherein the light-permeable electrode is formed to cover the entire upper surface of the wire-bonding electrode. This arrangement further enhances the effects of preventing peeling of the light-permeable electrode, reducing the effect of pattern misalignment, and improving the strength of the adhesion between the wire-bonding electrode and the semiconductor.

The invention also provides a method of producing the device electrode, comprising using metals to form the two layers of the light-permeable electrode and heat treatment in an oxygen atmosphere. This makes it easy to oxidize the metal of the second layer, which is the surface layer, to thereby impart light permeability. Also, part of the metal component of the second layer is diffused into the first layer, breaking down the oxide layer on the surface of the semiconductor. Provision of the light permeability and ohmic contact between the first layer and the semiconductor can both be achieved with a single heat treatment.

With the two-layer structure used in a conventional light-permeable electrode, heat treatment has to be performed at a high temperature in order to effect upward migration to the surface of the electrode layer and diffusion over a wide region. As a consequence, it is difficult to stably control the diffusion reaction and to achieve a stable quality for the ohmic properties and light permeability required for the light-permeable electrode. With the present invention, however, the surface layer metal is oxidized, so only a slight degree of diffusion is required, making it possible to control the diffusion reaction at even lower temperatures, and as such can be used to achieve stable-quality light-permeable electrodes over an even wider range of heat-treatment temperatures.

The present invention also provides method of producing the device electrode involving heat treatment of alloy layers in an oxygen atmosphere to form a light-permeable electrode having two layers. This can be done by first forming an alloy monolayer, and can therefore be achieved with a simple process. Metal that reacts strongly with the oxygen in the alloy layer can be easily oxidized to impart light permeability, and part of the metal can be used to break down oxides present on the surface of the semiconductor. Provision of the light permeability and ohmic contact with the semiconductor can both be achieved with a single heat treatment. With the two layer structure used in a conventional light-permeable electrode, it was difficult to achieve a stable qualities which were required for a light-permeable electrode. This invention can be implemented with just a slight degree of diffusion, making it possible to control the diffusion reaction at even lower temperatures, and as such can be used to achieve stable-quality light-permeable electrodes over an even wider range of heat-treatment temperatures.

While the invention has been described in detail and with reference to specific embodiments thereof, it will be apparent to one skilled in the art that various changes and modifications can be made therein without departing from the spirit and scope thereof.

What is claimed is:

1. An electrode for a light-emitting semiconductor device, formed on a surface of a p-type GaN-base compound semiconductor, comprising:
   a light-permeable electrode comprised of a first layer constituted of Au contacting the surface of the p-type GaN-base compound semiconductor, and a second layer, having a thickness in a range of 1 nm to 60 nm, formed on the first layer and comprising a light-permeable metal oxide containing an oxide of Ni; and
   a wire-bonding electrode that is electrically contacting the light-permeable electrode and partially contacting the surface of the p-type GaN-base compound semiconductor.

2. The electrode according to claim 1, wherein the wire-bonding electrode is contacting the p-type GaN-base compound semiconductor having a higher contact resistance per unit area with respect to the p-type GaN-base compound semiconductor than a region of the light-permeable electrode in contact with the p-type GaN-base compound semiconductor.

3. An electrode for a light-emitting semiconductor device, formed on a surface of a p-type GaN-base compound semiconductor, comprising:
   a light-permeable electrode contacting the surface of the p-type GaN-base compound semiconductor; and
   a wire-bonding electrode that is electrically contacting the light-permeable electrode and is partially contacting with the surface of the p-type GaN-base compound semiconductor with at least a region in contact with the p-type GaN-base compound semiconductor having a higher contact resistance per unit area with respect to the p-type GaN-base compound semiconductor than a region of the light-permeable electrode in contact with the p-type GaN-type compound semiconductor;
   wherein the light-permeable electrode contacts the surface of the p-type GaN-base compound semiconductor comprises Au.

* * * * *